US012193305B2

(12) United States Patent
Kim et al.

(10) Patent No.: US 12,193,305 B2
(45) Date of Patent: Jan. 7, 2025

(54) INPUT SENSING DISPLAY DEVICE INCLUDING A SHIELDING PART

(71) Applicant: SAMSUNG DISPLAY CO., LTD., Yongin-si (KR)

(72) Inventors: Hyungbae Kim, Hwaseong-si (KR); Taejoon Kim, Seongnam-si (KR); Jaewoo Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/456,509

(22) Filed: Nov. 24, 2021

(65) Prior Publication Data
US 2022/0262866 A1 Aug. 18, 2022

(30) Foreign Application Priority Data
Feb. 15, 2021 (KR) .......................... 10-2021-0019936

(51) Int. Cl.
| G06F 3/041 | (2006.01) |
| G06F 3/044 | (2006.01) |
| H10K 50/844 | (2023.01) |
| H10K 59/131 | (2023.01) |
| H10K 59/40 | (2023.01) |

(52) U.S. Cl.
CPC ............ *H10K 59/40* (2023.02); *G06F 3/0446* (2019.05); *H10K 50/844* (2023.02); *H10K 59/131* (2023.02); *G06F 2203/04107* (2013.01)

(58) Field of Classification Search
CPC ........... G06F 2203/04107; G06F 3/041; G06F 3/0416; G06F 3/04164; G06F 3/044
See application file for complete search history.

(56) References Cited

U.S. PATENT DOCUMENTS

| 10,720,474 | B2 | 7/2020 | Hwang et al. | |
| 10,915,210 | B2 | 2/2021 | Lee et al. | |
| 2019/0237533 | A1* | 8/2019 | Kim | ........................ H10K 59/40 |
| 2020/0194534 | A1* | 6/2020 | Park | ..................... H01L 51/5253 |
| 2020/0401274 | A1* | 12/2020 | Moon | ..................... G06F 3/045 |
| 2021/0026489 | A1* | 1/2021 | Lee | ..................... G06F 3/04164 |
| 2022/0075483 | A1* | 3/2022 | Yan | ..................... G06F 3/0418 |

FOREIGN PATENT DOCUMENTS

| KR | 101739799 | 5/2017 |
| KR | 20180066667 | 6/2018 |
| KR | 20200061056 | 6/2020 |

\* cited by examiner

*Primary Examiner* — Dennis P Joseph
(74) *Attorney, Agent, or Firm* — CHAU & ASSOCIATES, LLC

(57) ABSTRACT

A display panel includes a display panel and an input sensor disposed on the display panel. The input sensor includes an active region and an inactive region at least partially surrounding the active region. The input sensor includes a plurality of sensing electrodes disposed in the active region, a plurality of sensing lines disposed in the inactive region and connected to the sensing electrodes, a ground line extending outwardly to a greater extent than the sensing lines in the inactive region, and at least one shield layer extending from the ground line in the inactive region.

21 Claims, 26 Drawing Sheets

INPUT SENSING DISPLAY DEVICE INCLUDING A SHIELDING PART

CROSS-REFERENCE TO RELATED APPLICATION

This U.S. nonprovisional application claims priority under 35 U.S.C. § 119 to Korean Patent Application No. 10-2021-0019936 filed on Feb. 15, 2021 in the Korean Intellectual Property Office, the disclosure of which is hereby incorporated by reference in its entirety.

TECHNICAL FIELD

The present disclosure relates to a display device and, more specifically, to an input sensing display device including a shielding part.

DISCUSSION OF THE RELATED ART

Electronic products such as smart phones, digital cameras, laptop computers, vehicle navigation systems, and smart televisions include a display device for displaying an image to users. The display device generates an image on a display screen.

The display device may include a display panel that generates images and an input sensing part that is disposed on the display panel. The input sensing part detects external inputs such as a user's touch. The input sensing part includes a plurality of sensing electrodes that detect the external inputs.

In the display panel, first driving signals may be used for driving the display of the image and second driving signals may be used to drive the sensing electrodes. The input sensing part may be susceptible to noise caused by signal interference between the first driving signals and the second driving signals. For example, the second driving signals may be affected by the first driving signals and thus the sensing of the external inputs may be distorted.

SUMMARY

A display device includes a display panel; and an input sensing part disposed on the display panel. The input sensing part includes an active region and an inactive region at least partially surrounding the active region. The input sensing part includes a plurality of sensing electrodes disposed in the active region; a plurality of sensing lines disposed in the inactive region and connected to the sensing electrodes; a ground line extending outwardly to a greater extent than the sensing lines in the inactive region; and at least one shield layer extending from the ground line in the inactive region.

A display device includes a display panel that includes a pixel disposed in a display area and a dam disposed in a non-display area at least partially surrounding the display area, the dam surrounding the display area; and an input sensing part disposed on the display panel, the input sensing part includes an active region and an inactive region at least partially surrounding the active region. The input sensing part includes a plurality of sensing electrodes disposed in the active region; a ground line disposed on the inactive region; and a first shield layer extending from the ground line and overlapping a portion of the dam in the inactive region.

A display device includes a display panel; and an input sensing part disposed on the display panel. The input sensing part includes an active region and an inactive region at least partially surrounding the active region. The input sensing part includes a plurality of sensing electrodes disposed in the active region; a plurality of sensing lines disposed in the inactive region and connected to the sensing electrodes; a ground line extending outwardly to a greater extent than the sensing lines in the active region; and a plurality of shield layers extending from the ground line in the active region. In a plan view, the shield layers intersect the sensing lines.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
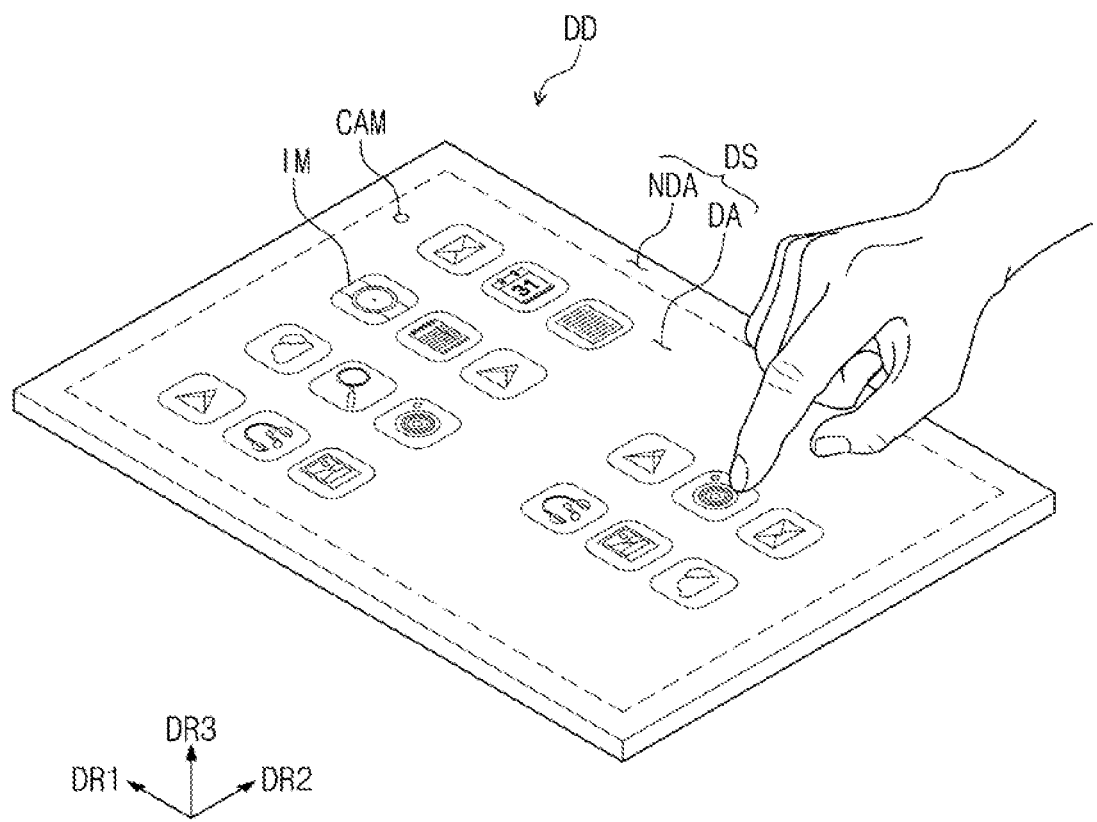
FIG. 1 is a perspective view showing a display device according to an embodiment of the present invention.

In this description, when a certain component (or region, layer, portion, etc.) is referred to as being "on", "connected to", or "coupled to" other component(s), the certain component may be directly on, directly connected to, or directly coupled to the other component(s) or at least one intervening component may be present therebetween.

Like numerals may indicate like components throughout the specification and the figures. Moreover, in the drawings, thicknesses, ratios, and dimensions of components may be exaggerated for effectively explaining the technical contents. The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof. In contrast, the term "consisting of" is intended to preclude the presence or addition of other features, integers, steps, operations, components, elements, other than what is expressly stated.

The following will now describe in detail some embodiments of the present invention in conjunction with the accompanying drawings.

FIG. 1 illustrates a perspective view showing a display device according to an embodiment of the present invention.

Referring to FIG. 1, a display device DD, according to an embodiment of the present invention, may have a substantially rectangular shape with a pair of long sides that extend in a first direction DR1 and a pair of short sides that extend in a second direction DR2 intersecting the first direction DR1. The present invention, however, is not necessarily limited thereto, and the display device DD may have various shapes such as a circular (or otherwise rounded or curved) shape or a polygonal shape.

A third direction DR3 is defined hereinafter as a direction that substantially vertically intersects a plane formed by the first and second directions DR1 and DR2. In this description, the phrase "in a plan view" means that "when viewed from the third direction DR3."

The display device DD may have a top surface instantiated as a display surface DS, and the top surface DS may have a plane defined by the first and second directions DR1 and DR2. The display surface DS may provide users with images IM generated from the display device DD.

The display surface DS may include a display area DA and a non-display area NDA at least partially surrounding the display area DA. The display area DA may display an image, and the non-display area NDA might display no image. The non-display area NDA may at least partially surround the display area DA and may provide the display device DD with an edge that is printed with a certain color. For example, the non-display area NDA may have a colored or otherwise light blocking edge or bezel.

The display device DD may include at least one camera CAM. The camera CAM may be disposed in the display area DA. For example, the camera CAM may be adjacent to a top side of the display area DA, but the position of the camera CAM is not necessarily limited thereto.

The display device DD may be used for large-sized display apparatuses, such as televisions, computer monitors, or outdoor billboards, etc. In addition, the display device DD may be used for small and medium-sized electronic products, such as personal computers, laptop computers, personal digital terminals, automotive navigation systems, game consoles, smart phones, tablet computers, or digital cameras. These products are presented by way of example and the display device DD may be used for any other electronic products without departing from the present inventive concept.

Figure 2:
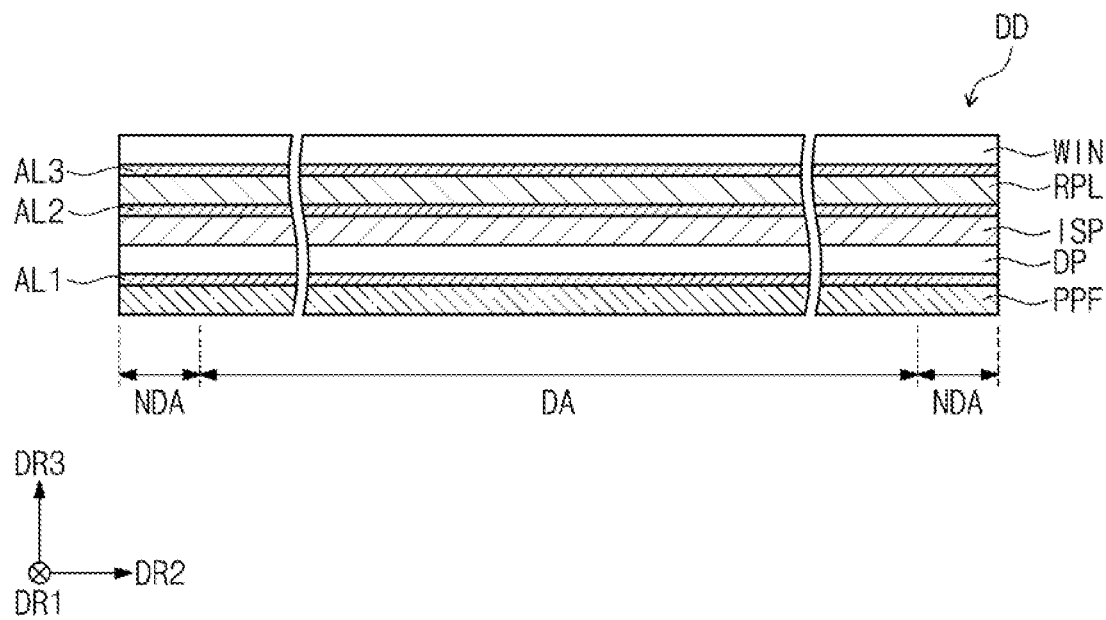
FIG. 2 is a cross-sectional view showing an example of the display device depicted in FIG. 1.

FIG. 2 is a cross-sectional view showing an example of the display device depicted in FIG. 1.

FIG. 2 shows, by way of example, a cross-section of the display device DD when viewed in the first direction DR1.

Referring to FIG. 2, the display device DD may include a display panel DP, an input sensing part ISP, an antireflection layer (i.e., reflection prevention layer) RPL, a window WIN, a panel protection film PPF, and first to third adhesive layers AL1 to AL3.

The display panel DP may be a flexible display panel. The display panel DP, according to an embodiment of the present invention, may be an emissive display panel, but the present invention is not necessarily limited thereto. For example, the display panel DP may be an organic light emitting diode (OLED) display panel or a quantum-dot light emitting display panel. An emission layer of the organic light emitting diode display panel may include an organic light emitting material. An emission layer of the quantum-dot light emitting display panel may include a quantum-dot or a quantum-rod. The following will describe an example in which an organic light emitting diode display panel is used as the display panel DP.

The input sensing part ISP may be disposed on the display panel DP. The input sensing part ISP may include a plurality of sensors that use a capacitance method to detect an external input. The input sensing part ISP may be directly fabricated on the display panel DP during fabrication of the display device DD. The present invention, however, is not necessarily limited thereto, and when the display panel DP is manufactured, the input sensing part ISP may be separately fabricated in the form of a panel and then attached to the display panel DP through an adhesive.

The antireflection layer RPL may be disposed on the input sensing part ISP. The antireflection layer RPL may be instantiated as a film for preventing reflection of external light. The antireflection layer RPL may reduce a reflectance of external light that is incident toward the display panel DP from outside the display device DD.

When a user sees external light that is reflected from the display panel DP, a mirror effect may be recognized. To prevent effects of the phenomenon above, the antireflection layer RPL may include a plurality of color filters that display the same colors as those generated from pixels of the display panel DP.

The color filters may be configured such that the external light is filtered into the same colors as those generated from the pixels. In this case, the external light might not be visible to users. The present invention, however, is not necessarily limited thereto, and the antireflection layer RPL may include a retarder and/or a polarizer.

The window WIN may be disposed on the antireflection layer RPL. The window WIN may protect the display panel DP, the input sensing part ISP, and the antireflection layer RPL against external scratches and impact.

The panel protection film PPF may be disposed below the display panel DP. The panel protection film PPF may protect a lower portion of the display panel DP. The panel protection film PPF may include a flexible plastic material, such as polyethylene terephthalate (PET).

The first adhesive layer AL1 may be disposed between the display panel DP and the panel protection film PPF. The first adhesive layer AL1 may attach the display panel DP and the panel protection film PPF to each other.

The second adhesive layer AL2 may be disposed between the antireflection layer RPL and the input sensing part ISP. The second adhesive layer AL2 may attach the antireflection layer RPL and the input sensing part ISP to each other.

The third adhesive layer AL3 may be disposed between the window WIN and the antireflection layer RPL. The third adhesive layer AL3 may attach the window WIN and the antireflection layer RPL to each other.

Figure 3:
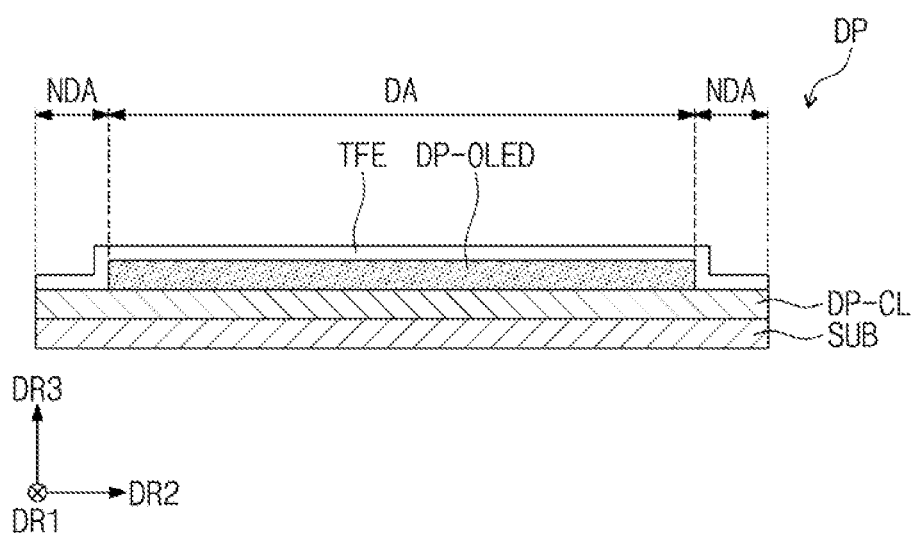
FIG. 3 is a cross-sectional view showing an example of a display panel depicted in FIG. 2.

FIG. 3 is a cross-sectional view showing an example of the display panel depicted in FIG. 2.

FIG. 3 shows, by way of example, a cross-section of the display panel DP when viewed in the first direction DR1.

Referring to FIG. 3, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display area DA and a non-display area NDA at least partially surrounding the display area DA. The substrate SUB may include a flexible plastic material, such as polyimide (PI). The display element layer DP-OLED may be disposed on the display area DA.

A plurality of pixels may be disposed on the circuit element layer DP-CL and the display element layer DP-OLED. Each of the pixels may include a transistor disposed on the circuit element layer DP-CL, and may also include a light emitting element disposed on the display element layer DP-OLED and connected to the transistor. A configuration of the pixel will be further discussed in detail below.

The thin-film encapsulation layer TFE may be disposed on the circuit element layer DP-CL and may cover the display element layer DP-OLED. The thin-film encapsulation layer TFE may include inorganic layers and an organic layer disposed between the inorganic layers. The inorganic layers may protect the pixels against moisture and/or oxygen. The organic layer may protect the pixels against foreign substances such as dust particles.

Figure 4:
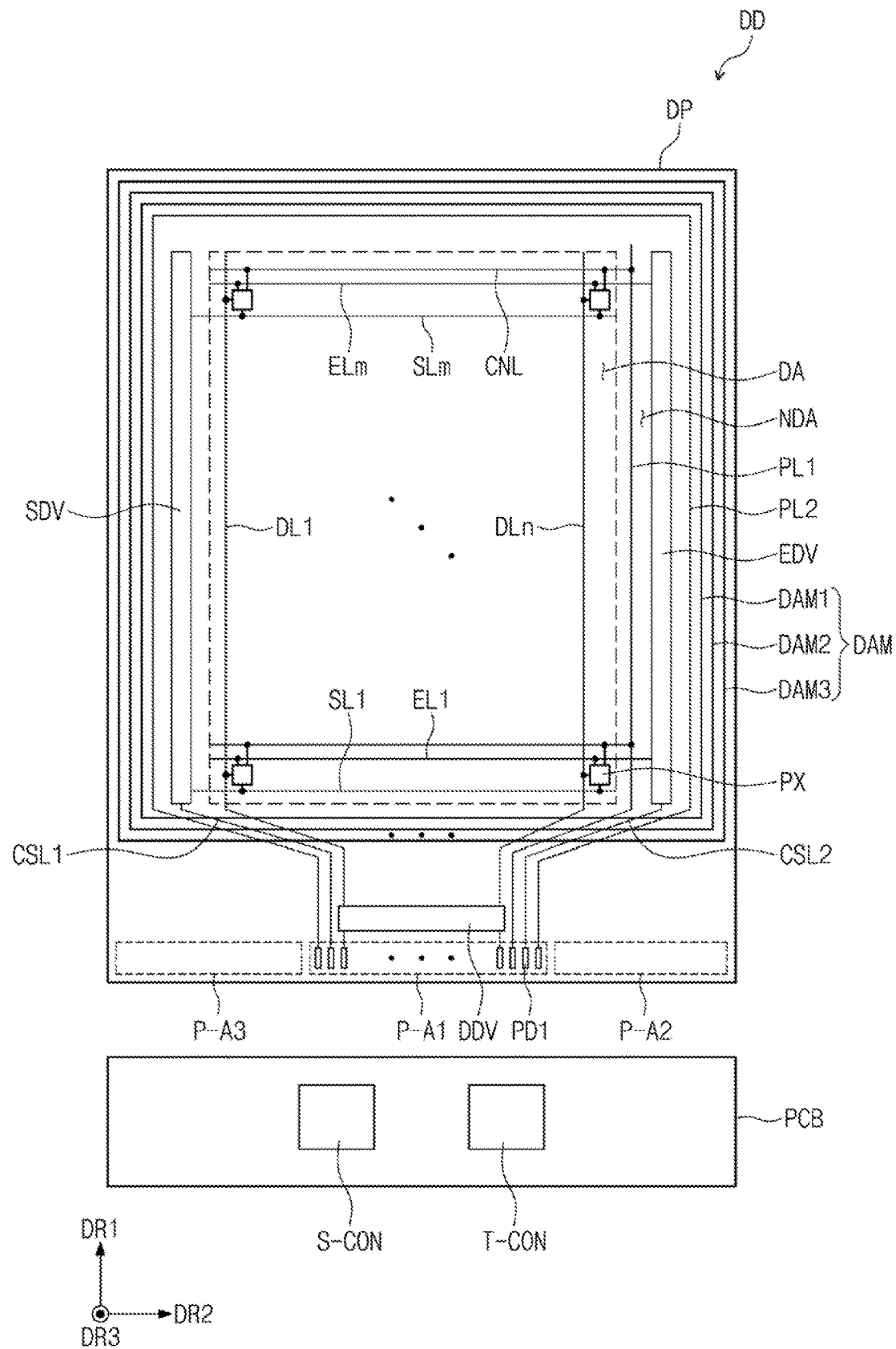
FIG. 4 is a plan view showing the display panel depicted in FIG. 3.

FIG. 4 is a plan view showing the display panel depicted in FIG. 3.

Referring to FIG. 4, the display device DD may include a display panel DP, a scan driver SDV, a data driver DDV, an emission driver EDV, a printed circuit board PCB, a timing controller T-CON, a sensing controller S-CON, and a plurality of dams DAM.

The display panel DP may have a rectangular shape with long sides that extend in the first direction DR1 and short sides that extend in the second direction DR2. The display panel DP may include a display area DA and a non-display area NDA that surrounds the display area DA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, connection lines CNL, and a plurality of first pads PD1. The subscripts "m" and "n" are natural numbers.

The pixels PX may be disposed on the display area DA. The scan driver SDV and the emission driver EDV may be disposed on the non-display area NDA adjacent to the long side of the display panel DP. The data driver DDV may be disposed on the non-display area NDA adjacent to one of the short sides of the display panel DP. In a plan view, the data driver DDV may be adjacent to a bottom end of the display panel DP. The data driver DDV may be fabricated in the form of an integrated circuit chip and may be mounted on the display panel DP.

The scan lines SL1 to SLm may extend in the second direction DR2 and may connect with the pixels PX and the scan driver SDV. The data lines DL1 to DLn may extend in the first direction DR1 and may connect with the pixels PX and the data driver DDV. The emission lines EL1 to ELm may extend in the second direction DR2 and may connect with the pixels PX and the emission driver EDV.

The first power line PL1 may extend in the first direction DR1 to be disposed on the non-display area NDA. The first power line PL1 may be disposed between the display area DA and the emission driver EDV or between the display area DA and the scan driver SDV, but the present invention is not necessarily limited thereto.

The connection lines CNL may extend in the second direction DR2 and may be arranged in the first direction DR1. The connection lines CNL may be connected to the first power line PL1 and the pixels PX. The pixels PX may be supplied with a first voltage though the first power line PL1 and the connection lines CNL coupled to the first power line PL1.

The second power line PL2 may be disposed on the non-display area NDA. The second power line PL2 may extend along the long sides of the display panel DP and along the short side around which the data driver DDV is not disposed. The second power line PL2 may extend outwardly to a greater extent than the scan driver SDV and the emission driver EDV.

The second power line PL2 may extend toward the display area DA and may connect with the pixels PX. The second power line PL2 may supply the pixels PX with a second voltage less than the first voltage.

The first control line CSL1 may be connected to the scan driver SDV, and in a plan view, may extend toward the bottom end of the display panel DP. The second control line CSL2 may be connected to the emission driver EDV, and in a plan view, may extend toward the bottom end of the display panel DP. The data driver DDV may be disposed between the first control line CSL1 and the second control line CSL2.

The display panel DP may be provided with a first pad region P-A1, a second pad region P-A2, and a third pad region P-A3 on a location adjacent to the bottom end of the display panel DP. The first pad region P-A1, the second pad region P-A2, and the third pad region P-A3 may be arranged in the second direction DR2. The first pad region P-A1 may be disposed between the second pad region P-A2 and the third pad region P-A3.

The first pads PD1 may be disposed on the first pad region P-A1. The first pads PD1 may be connected to the data driver DDV, the first power line PL1, the second power line PL2, the first control line CSL1, and the second control line CSL2. The data lines DL1 to DLn may be connected to the data driver DDV, and the data driver DDV may be connected to the first pads PD1 that correspond to the data lines DL1 to DLn.

The printed circuit board PCB may be connected to the first pads PD1. The timing controller T-CON and the sensing controller S-CON may each be fabricated in the form of an integrated circuit chip and may be mounted on the printed circuit board PCB. The timing controller T-CON may be connected through the printed circuit board PCB to the first pads PD1 that are coupled to the data driver DDV and the first and second control lines CSL1 and CSL2.

The printed circuit board PCB may be provided thereon with a voltage generator which produces the first and second voltages and which is connected to the first pads PD1 coupled to the first and second power lines PL1 and PL2.

The timing controller T-CON may generate a scan control signal, a data control signal, and an emission control signal. The scan control signal may be provided through the first control line CSL1 to the scan driver SDV. The emission control signal may be provided through the second control line CSL2 to the emission driver EDV. The data control signal may be provided to the data driver DDV. The timing controller T-CON may provide the data driver DDV with image signals.

In response the scan control signal, the scan driver SDV may generate a plurality of scan signals, and the scan signals may be applied through the scan lines SL1 to SLm to the pixels PX.

In response to the data control signal, the data driver DDV may generate a plurality of data voltages that correspond to the image signals. The data voltages may be applied through the data lines DL1 to DLn to the pixels PX.

In response to the emission control signal, the emission driver EDV may generate a plurality of emission signals, and the emission signals may be applied through the emission lines EL1 to ELn to the pixels PX.

In response to the scan signals, the pixels PX may be provided with the data voltages. In response to the emission signals, the pixels PX may emit light with brightness corresponding to the data voltages, thereby displaying an image. The emission signals may control light emission timing of the pixels PX.

The sensing controller S-CON may be connected through the printed circuit board PCB to second and third pads of the input sensing part ISP, which second and third pads will be discussed below. The sensing controller S-CON may provide the input sensing part ISP with signals configured to drive the input sensing part ISP.

The dams DAM may be disposed on the non-display area NDA. The dams DAM may extend along an edge of the display panel DP and may at least partially surround the display area DA. The dams DAM may extend outwardly to a greater extent than the second power line PL2, while being along the long sides of the display panel DP and along the short side around which the data driver DDV is not disposed. The dams DAM may extend between the data driver DDV and the display area DA, while being along the short side around which the data driver DDV is disposed.

The dams DAM may include a plurality of first, second, and third dams DAM1, DAM2, and DAM3 which are disposed on the non-display area NDA and which surround the display area DA. The first dam DAM1 may be closer than the second and third dams DAM2 and DAM3 to the display area DA, and the third dam DAM3 may be adjacent to the edge of the display panel DP. The second dam DAM2 may be disposed between the first dam DAM1 and the third dam DAM3.

Three dams DAM1, DAM2, and DAM3 are illustrated by way of example, but no limitation is imposed on the number of the dams DAM. For example, the display panel DP may be provided with at least one dam DAM.

Figure 5:
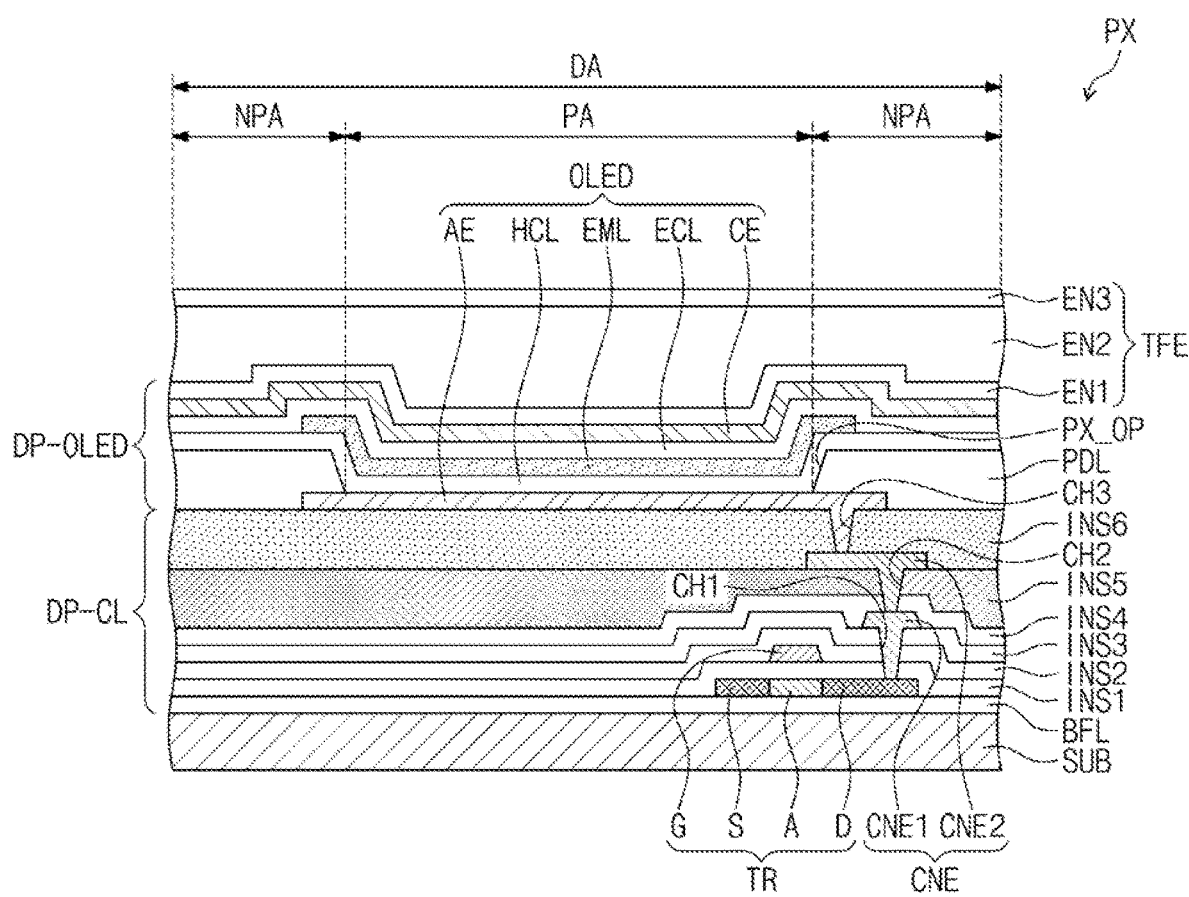
FIG. 5 is a cross-sectional view showing an example of one pixel depicted in FIG. 4.

FIG. 5 is a cross-sectional view showing an example of one pixel depicted in FIG. 4.

Referring to FIG. 5, the pixel PX may include a transistor TR and a light emitting element OLED. The light emitting element OLED may include a first electrode AE, a second electrode CE, a hole control layer HCL, an electron control layer ECL, and an emission layer EML. The first electrode AE may be an anode electrode, and the second electrode CE may be a cathode electrode.

The transistor TR and the light emitting element OLED may be disposed on the substrate SUB. Although a single transistor TR is illustrated by way of example, the pixel PX may substantially include at least one capacitor and a plurality of transistors for driving the light emitting element OLED.

The display area DA may include an emission region PA that corresponds to a corresponding one of the pixels PX and a non-emission region NPA at least partially surrounding the emission region PA. The light emitting element OLED may be disposed on the emission region PA.

A buffer layer BFL may be disposed on the substrate SUB, and the buffer layer BFL may be an inorganic layer. A semiconductor pattern may be disposed on the buffer layer BFL. The semiconductor pattern may include polysilicon. The present invention, however, is not necessarily limited thereto, and the semiconductor pattern may include amorphous silicon or metal oxide.

The semiconductor pattern may be doped with n-type or p-type impurities. The semiconductor pattern may include a heavily doped section and a lightly doped section. The heavily doped section may have conductivity greater than that of the lightly doped section, and may serve as source and drain electrodes of the transistor TR. The lightly doped section may substantially correspond to an active (or channel) of the transistor TR.

The transistor TR may include a source S, an active A, and a drain D that are formed of the semiconductor pattern. A first dielectric layer INS1 may be disposed on the semiconductor pattern. The first dielectric layer INS1 may be provided thereon with a gate G of the transistor TR. A second dielectric layer INS2 may be disposed on the gate G. A third dielectric layer INS3 may be disposed on the second dielectric layer INS2.

The transistor TR and the light emitting element OLED may be provided therebetween with a connection electrode CNE that may connect the transistor TR to the light emitting element OLED. The connection electrode CNE may include a first connection electrode CNE1 and a second connection electrode CNE2.

The first connection electrode CNE1 may be disposed on the third dielectric layer INS3, and may be connected to the drain D through a first contact hole CH1 defined in the first to third dielectric layers INS1 to INS3. A fourth dielectric layer INS4 may be disposed on the first connection electrode CNE1. A fifth dielectric layer INS5 may be provided on the fourth dielectric layer INS4. The second connection electrode CNE2 may be disposed on the fifth dielectric layer INS5. The second connection electrode CNE2 may be connected to the first connection electrode CNE1 through a second contact hole CH2 defined in the fourth and fifth dielectric layers INS4 and INS5.

A sixth dielectric layer INS6 may be disposed on the second connection electrode CNE2. The circuit element layer DP-CL may include layers from the buffer layer BFL to the fifth dielectric layer INS5. The first to sixth dielectric layers INS1 to INS6 may be inorganic or organic layers.

The first electrode AE may be disposed on the sixth dielectric layer INS6. The first electrode AE may be connected to the second connection electrode CNE2 through a third contact hole CH3 defined in the sixth dielectric layer INS6. A pixel definition layer PDL may be disposed on the first electrode AE and the sixth dielectric layer INS6, and the pixel definition layer PDL may expose a portion of the first electrode AE. The pixel definition layer PDL may have an opening PX_OP that exposes the portion of the first electrode AE.

The hole control layer HCL may be disposed on the first electrode AE and the pixel definition layer PDL. The hole control layer HCL may be disposed in common on the emission region PA and the non-emission region NPA. The hole control layer HCL may include a hole transport layer and a hole injection layer.

The emission layer EML may be disposed on the hole control layer HCL. The emission layer EML may be disposed on a location that corresponds to the opening PX_OP. The emission layer EML may include an organic material and/or an inorganic material. The emission layer EML may generate one of a red light, a green light, and a blue light.

The electron control layer ECL may be disposed on the emission layer EML and the hole control layer HCL. The electron control layer ECL may be disposed in common on the emission region PA and the non-emission region NPA. The electron control layer ECL may include an electron transport layer and an electron injection layer.

The second electrode CE may be disposed on the electron control layer ECL. The second electrode CE may be disposed in common on the pixels PX. A section where the light emitting element OLED is disposed may be instantiated as the display element layer DP-OLED.

The second electrode CE may be provided thereon with the thin-film encapsulation layer TFE that may cover the pixel PX. The thin-film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

Each of the first and third encapsulation layers EN1 and EN3 may be an inorganic layer, and the second encapsulation layer EN2 may be an organic layer. The first and third encapsulation layers EN1 and EN3 may protect the pixel PX against moisture and/or oxygen. The second encapsulation layer EN2 may protect the pixel PX against foreign substances such as dust particles.

A first voltage may be applied through the transistor TR to the first electrode AE, and a second voltage may be applied to the second electrode CE. Holes and electrons injected into the emission layer EML may combine with each other to produce excitons, and the light emitting element OLED may emit light as the excitons return to ground state.

Figure 6:
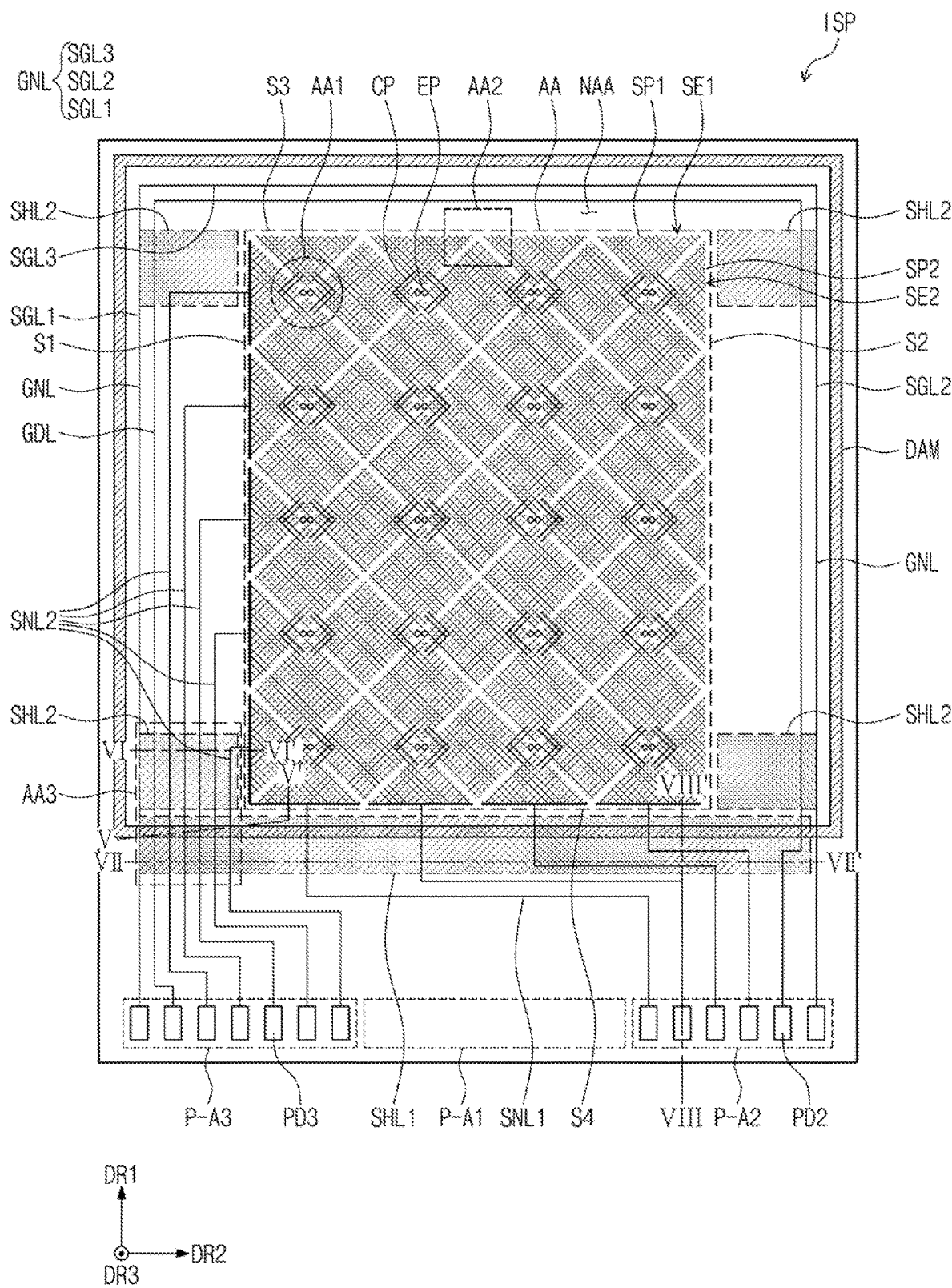
FIG. 6 is a plan view showing an input sensing part depicted in FIG. 2.

FIG. 6 is a plan view showing the input sensing part depicted in FIG. 2.

FIG. 6 shows, by way of example, the input sensing part ISP together with a shaded zone on which the dams DAM are disposed.

Referring to FIG. 6, the input sensing part ISP may include a plurality of sensing electrodes SE1 and SE2, a plurality of sensing lines SNL1 and SNL2, a ground line GNL, a guard line GDL, a plurality of second and third pads PD2 and PD3, and a plurality of shield layers SHL1 and SHL2. The sensing electrodes SE1 and SE2, the sensing lines SNL1 and SNL2, the ground line GNL, the guard line GDL, and the shield layers SHL1 and SHL2 may be disposed on the thin-film encapsulation layer TFE discussed above.

The input sensing part ISP may have an active region AA and an inactive region NAA at least partially surrounding the active region AA. The active region AA may overlap the display area DA, and the inactive region NAA may overlap the non-display area NDA. The sensing electrodes SE1 and SE2 may be disposed on the active region AA, and the second and third pads PD2 and PD3 may be disposed on the inactive region NAA.

The sensing lines SNL1 and SNL2 may be disposed on the inactive region NAA. The sensing lines SNL1 and SNL2 may be connected to ends of the sensing electrodes SE1 and SE2, and may extend toward the inactive region NAA and may connect with the second and third pads PD2 and PD3. The second and third pads PD2 and PD3 may be connected to the printed circuit board PCB discussed above. The aforementioned sensing controller S-CON may be connected through the printed circuit board PCB to the second and third pads PD2 and PD3.

The sensing electrodes SE1 and SE2 may include a plurality of first sensing electrodes SE1 that extend in the first direction DR1 and are arranged in the second direction DR2, and may also include a plurality of second sensing electrodes SE2 that extend in the second direction DR2 and are arranged in the first direction DR1. The second sensing electrodes SE2 may extend to intersect the first sensing electrodes SE1, while being insulated from the first sensing electrodes SE1.

The sensing lines SNL1 and SNL2 may include a plurality of first sensing lines SNL1 connected to the first sensing electrodes SE1 and a plurality of second sensing lines SNL2 connected to the second sensing electrodes SE2. The first sensing lines SNL1 may be connected to the second pads PD2. The second sensing lines SNL2 may be connected to the third pads PD3.

The first sensing electrodes SE1 may be instantiated as input sensing electrodes, and the second sensing electrodes SE2 may be instantiated as output sensing electrodes. The input sensing part ISP may be driven in a mutual sensing mode. For example, driving signals may be input through the first sensing lines SNL1 to the first sensing electrodes SE1, and sensing signals may be output through the second sensing lines SNL2 from the second sensing electrodes SE2. The aforementioned sensing controller S-CON may output the driving signals and may receive the sensing signals.

The ground line GNL and the guard line GDL may be disposed on the inactive region NAA. The ground line GNL and the guard line GDL may extend outwardly to a greater extent than the first and second sensing lines SNL1 and SNL2. The ground line GNL may extend outwardly to a greater extent than the guard line GDL. Therefore, the guard line GDL may be disposed between the ground line GNL and the sensing lines SNL1 and SNL2.

The active region AA may include a first side S1, a second side S2, a third side S3, and a fourth side S4 that are connected to form a tetragonal shape. The first side S1 and the second side S2 may extend in the first direction DR1 and may be opposite to each other in the second direction DR2. The third side S3 and the fourth side S4 may extend in the second direction DR2 and may be opposite to each other in the first direction DR1. The second and third pads PD2 and PD3 may be disposed on the inactive region NAA proximate to the fourth side S4.

The ground line GNL may be connected to a corresponding one of the third pads PD3, and may extend along the first side S1, the third side S3, and the second side S2 and may connect with a corresponding one of the second pads PD2. The ground line GNL may be connected to an outermost third pad PD3 and an outermost second pad PD2.

The guard line GDL may be connected to a corresponding one of the third pads PD3, and may extend along the first side S1, the third side S3, and the second side S2 and may connect with a corresponding one of the second pads PD2. The second and third pads PD2 and PD3 connected to the guard line GDL may be disposed between the second and third pads PD2 and PD3 connected to the first and second sensing lines SNL1 and SNL2 and the second and third pads PD2 and PD3 connected to the ground line GNL.

A ground voltage may be applied to the ground line GNL. The ground line GNL may be connected through the second and third pads PD2 and PD3 to a ground terminal of the display device DD. Static electricity may be applied from an external source to the input sensing part ISP. In this case, the externally sourced static electricity may be discharged through the ground line GNL to the ground terminal. Therefore, the ground line GNL may protect the input sensing part ISP against the externally sourced static electricity.

The ground line GNL is exemplarily disposed continuously along the first side S1, the third side S3, and the second side S2, but the present invention is not necessarily limited thereto, and the ground line GNL may be discontinuous due to cut-off at its portion proximate to the third side S3.

The ground line GNL may include a first sub-ground line SGL1 disposed on the inactive region NAA proximate to the first side S1, a second sub-ground line SGL2 disposed on the inactive region NAA proximate to the second side S2, and a third sub-ground line SGL3 disposed on the inactive region NAA proximate to the third side S3.

The guard line GDL may be connected to the sensing controller S-CON. The guard line GDL may receive a predetermined level signal through the second and third pads PD2 and PD3 from the sensing controller S-CON.

A difference in potential between the ground line GNL and the first and second sensing lines SNL1 and SNL2 may induce a coupling phenomenon between the ground line GNL and the first and second sensing lines SNL1 and SNL2. For example, noise may be generated due to signal interference between lines.

To reduce the issues mentioned above, a single having a predetermined level may be applied to the guard line GDL. The guard line GDL may be disposed between the ground line GNL and the first and second sensing lines SNL1 and SNL2, thereby reducing the coupling phenomenon between the ground line GNL and the first and second sensing lines SNL1 and SNL2.

The guard line GDL is exemplarily disposed continuously along the first side S1, the third side S3, and the second side S2, but the present invention is not necessarily limited thereto, and the guard line GDL may be discontinuous due to cut-off at its portion proximate to the third side S3. In this case, the sensing controller S-CON may apply a signal through the second pad PD2 to the guard line GDL proximate to the second side S2, and may apply a signal though the third pad PD3 to the guard line GDL proximate to the first side S1. The guard line GDL may be omitted.

Each of the first sensing electrodes SE1 may include a plurality of first sensing parts SP1 that are arranged in the first direction DR1 and a plurality of connection patterns CP that connect the first sensing parts SP1 to each other. Each of the connection patterns CP may be disposed between two first sensing parts SP1 adjacent to each other in the first direction DR1, thereby connecting the two first sensing parts SP1 to each other.

Each of the second sensing electrodes SE2 may include a plurality of second sensing parts SP2 that are arranged in the second direction DR2 and a plurality of extension patterns EP that extend from the second sensing parts SP2. Each of the extension patterns EP may be disposed between two second sensing parts SP2 adjacent to each other in the second direction DR2, thereby extending from the two second sensing parts SP2.

The first sensing parts SP1 may have a mesh shape, and likewise the second sensing parts SP2 may have a mesh shape. The first sensing parts SP1 may be spaced apart from and alternately arranged with the second sensing parts SP2, with no overlap between the first sensing parts SP1 and the second sensing parts SP2. The first and second sensing parts SP1 and SP2 may produce capacitance. The extension patterns EP might not overlap the connection patterns CP.

The first and second sensing parts SP1 and SP2 and the extensions patterns EP may be located at the same level. The connection patterns CP may be located at a different level from that of the first and second sensing parts SP1 and SP2 and the extensions patterns EP.

On a location proximate to the first, third, and second sides S1, S3, and S2, the dams DAM may extend outwardly to a greater extent than the ground line GNL. The ground line GNL, the guard line GDL, and the first and second sensing lines SNL1 and SNL2 may extend to interest each other on a location proximate to the fourth side S4.

The first and second sensing lines SNL1 and SNL2 may extend to intersect the dams DAM, but the present invention is not necessarily limited thereto. For example, the first and second sensing lines SNL1 and SNL2 may extend in the first direction DR1, and then may turn to extend in the second direction DR2. When the first and second sensing lines SNL1 and SNL2 are disposed to have their portions that extend in the second direction DR2 to overlap the dams DAM, the first and second sensing lines SNL1 and SNL2 may extend parallel to the dams DAM.

On the inactive region NAA, the shield layers SHL1 and SHL2 may extend from the ground line GNL. In a plan view, the shield layers SHL1 and SHL2 may extend to intersect the first and second sensing lines SNL1 and SNL2. In a plan view, the shield layers SHL1 and SHL2 may overlap portions of the first and second sensing lines SNL1 and SNL2. In a plan view, one SHL1 of the shield layers SHL1 and SHL2 may be disposed to overlap portions of the dams DAM proximate to the fourth side S4.

The shield layers SHL1 and SHL2 may include a first shield layer SHL1 and a plurality of second shield layers SHL2. The first shield layer SHL1 may be adjacent to the fourth side S4 and may extend in the second direction DR2. In a plan view, the first shield layer SHL1 may overlap portions of the dams DAM proximate to the fourth side S4.

The first shield layer SHL1 may extend from the first sub-ground line SGL1. The first shield layer SHL1 may be adjacent to the second sub-ground line SGL2. The first shield layer SHL1 may be spaced apart from the second sub-ground line SGL2 without being connected to the second sub-ground line SGL2.

The second shield layers SHL2 may extend from the ground line GNL toward the active region AA, thereby being adjacent to the active region AA. The second shield layers SHL2 may extend toward the first side S1 and the second side S2, and thus may be disposed adjacent to the first side S1 and the second side S2. The second shield layers SHL2 may extend from the first sub-ground line SGL1 toward the first side S1, and may extend from the second sub-ground line SGL2 toward the second side S2.

In a plan view, the second shield layers SHL2 may be adjacent to left and right sides of the active region AA that are close to top and bottom sides of the active region AA. For example, the second shield layers SHL2 may be disposed adjacent to a portion of the first side S1 close to the third side S3, a portion of the first side S1 close to the fourth side S4, a portion of the second side S2 close to the third side S3, and a portion of the second side S2 close to the fourth side S4.

The following description will focus on functions of the first and second shield layers SHL1 and SHL2.

Figure 7:
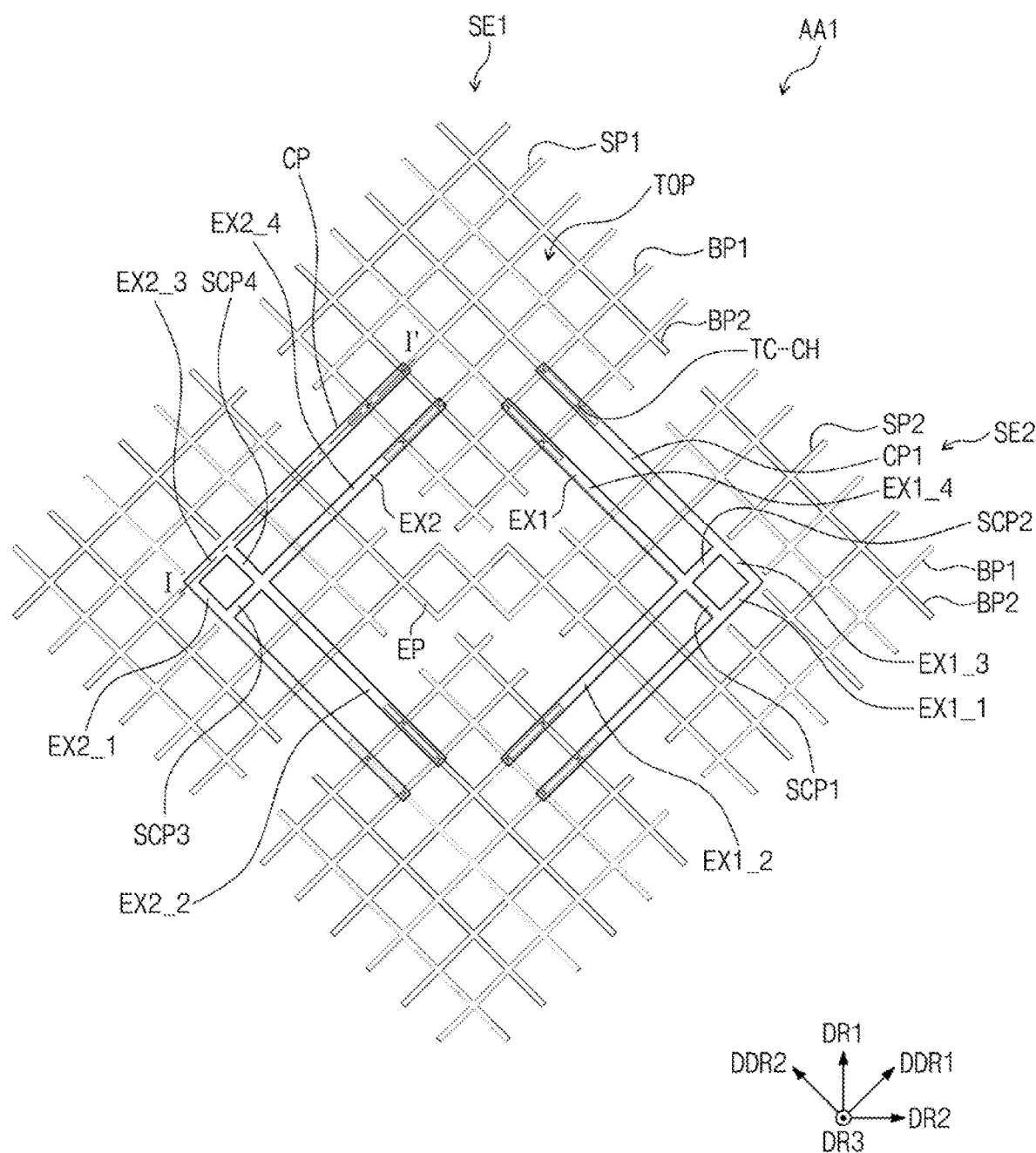
FIG. 7 is an enlarged view showing a first region AA1 depicted in FIG. 6.

FIG. 7 is an enlarged view showing a first region AA1 depicted in FIG. 6.

Referring to FIG. 7, to have a mesh shape, each of the first and second sensing parts SP1 and SP2 may include a plurality of first branches BP1 that extend in a first diagonal direction DDR1 and a plurality of second branches BP2 that extend in a second diagonal direction DDR2.

The first diagonal direction DDR1 may be a direction that intersects the first and second directions DR1 and DR2 on a plane defined by the first and second directions DR1 and DR2. The second diagonal direction DDR2 may refer to a direction that intersects the first diagonal direction DDR1 on a plane defined by the first and second directions DR1 and DR2. For example, the first and second directions DR1 and DR2 may orthogonally intersect each other, and the first and second diagonal directions DDR1 and DDR2 may orthogonally intersect each other.

The first branches BP1 of each of the first and second sensing parts SP1 and SP2 may intersect the second branches BP2 of each of the first and second sensing parts SP1 and SP2, and the first and second branches BP1 and BP2 of each of the first and second sensing parts SP1 and SP2 may be unitarily formed with each other. The first branches BP1 and the second branches BP2 may define touch openings TOP each having a rhombic shape.

The connection pattern CP may extend without overlapping the extension pattern EP, and may connect the first sensing parts SP1 to each other. The connection pattern CP may be connected to the first sensing parts SP1 through a plurality of contact holes TC-CH. The connection pattern CP may extend toward the first sensing parts SP1 after passing through regions that overlap the second sensing parts SP2.

The extension pattern EP may be disposed between the first sensing parts SP1 and may extend from the second sensing parts SP2. The second sensing parts SP2 and the extension pattern EP may be formed unitarily with each other. The extension pattern EP may have a mesh shape. The extension pattern EP, the first sensing parts SP1, and the second sensing parts SP2 may be formed of the same material and may be formed by being patterned at the same time. The extension pattern EP, the first sensing parts SP1, and the second sensing parts SP2 may be located at the same level.

The connection pattern CP may include a first extension EX1 and a second extension EX2 whose shape is symmetrical to that of the first extension EX1. The extension pattern EP may be disposed between the first extension EX1 and the second extension EX2. The first extension EX1 may extend through a zone that overlaps one of the second sensing parts SP2, and may be connected to the first sensing parts SP1. The second extension EX2 may extend through a zone that overlaps another of the second sensing parts SP2, and may be connected to the first sensing parts SP1.

Based on its relative position, the first sensing part SP1 may be referred to herein as an upper-side first sensing part SP1 or a lower-side first sensing part SP1. In addition, based on its relative position, the second sensing part SP2 may be referred to herein as a left-side second sensing part SP2 or a right-side second sensing part SP2.

The first and second extensions EX1 and EX2 may have portions adjacent to sides thereof, and the portions may be connected through a plurality of contact holes TC-CH to the lower-side first sensing part SP1. The first and second extensions EX1 and EX2 may have portions adjacent to other sides thereof, and the portions may be connected through a plurality of contact holes TC-CH to the upper-side first sensing part SP1. A structure of the contact hole TC-CH will be illustrated in FIG. 8 below.

The first extension EX1 may include a first sub-extension EX1_1 and a second sub-extension EX1_2 that extend in the first diagonal direction DDR1, a third sub-extension EX1_3 and a fourth sub-extension EX1_4 that extend in the second diagonal direction DDR2, a first sub-conductive pattern SCP1 that extends in the second diagonal direction DDR2, and a second sub-conductive pattern SCP2 that extends in the first diagonal direction DDR1.

The first and second sub-extensions EX1_1 and EX1_2 may have portions adjacent to sides thereof, and the portions may be connected through a plurality of contact holes TC-CH to the lower-side first sensing part SP1. The third and fourth sub-extensions EX1_3 and EX1_4 may have portions adjacent to sides thereof, and the portions may be connected through a plurality of contact holes TC-CH to the upper-side first sensing part SP1.

The first sub-extension EX1_1 may have another side that extends from another side of the third sub-extension EX1_3, and the second sub-extension EX1_2 may have another side that extends from another side of the fourth sub-extension EX1_4. The first sub-conductive pattern SCP1 may extend in the second diagonal direction DDR2 from the other side of the fourth sub-extension EX1_4 toward the first sub-extension EX1_1. The second sub-conductive pattern SCP2 may extend in the first diagonal direction DDR1 from the other side of the second sub-extension EX1_2 toward the third sub-extension EX1_3.

The first, second, third, and fourth sub-extensions EX1_1, EX1_2, EX1_3, and EX1_4 and the first and second sub-conductive patterns SCP1 and SCP2 may be formed unitarily with each other (e.g., they may all be part of a single contiguous structure).

The first and second sub-extensions EX1_1 and EX1_2 may extend to intersect ones of the second branches BP2 of the right-side second sensing part SP2, which ones of the second branches BP2 are adjacent to the lower-side first sensing part SP1. None of the first branches BP1 of the right-side second sensing part SP2 may be disposed on a zone that overlaps the first and second sub-extensions EX1_1 and EX1_2 and the second sub-conductive pattern SCP2.

The third and fourth sub-extensions EX1_3 and EX1_4 may extend to intersect ones of the first branches BP1 of the right-side second sensing part SP2, which ones of the first branches BP1 are adjacent to the upper-side first sensing part SP1. None of the second branches BP2 of the right-side second sensing part SP2 may be disposed on a zone that overlaps the third and fourth sub-extensions EX1_3 and EX1_4 and the first sub-conductive pattern SCP1.

The second extension EX2 may include a fifth sub-extension EX2_1 and a sixth sub-extension EX2_2 that extend in the second diagonal direction DDR2, a seventh sub-extension EX2_3 and an eighth sub-extension EX2_4 that extend in the first diagonal direction DDR1, a third sub-conductive pattern SCP3 that extends in the first diagonal direction DDR1, and a fourth sub-conductive pattern SCP4 that extends in the second diagonal direction DDR2.

The left-side second sensing part SP2 may have a structure that is symmetrical to that of the right-side second sensing part SP2, and the second extension EX2 may have a structure that is symmetrical to that of the first extension EX1. To the extent that a description of the fifth to eighth sub-extensions EX2_1 to EX2_4 and the third and fourth sub-conductive patterns SCP3 and SCP4 have been omitted, it may be assumed that these elements are at least similar to the corresponding elements previously described herein.

Figure 8:
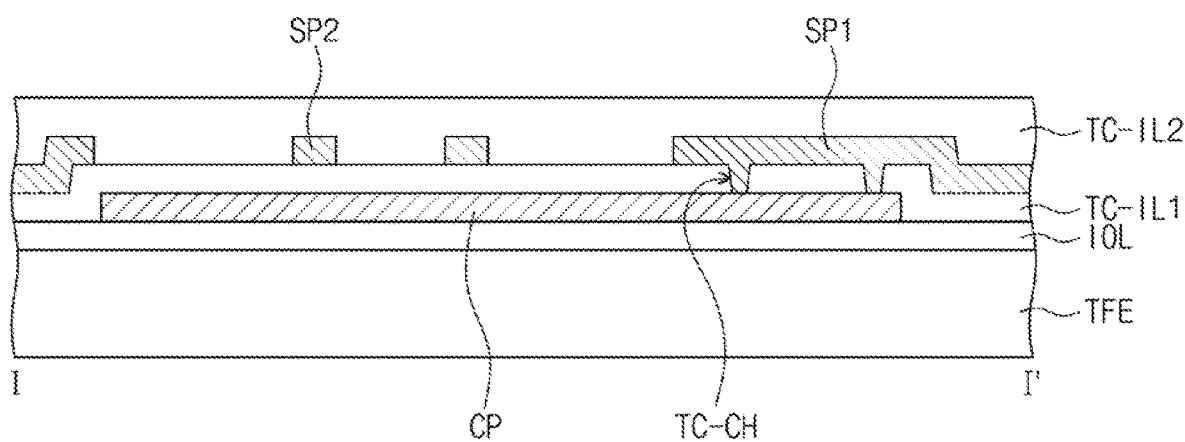
FIG. 8 is a cross-sectional view taken along line I-I' of FIG. 7.

FIG. 8 is a cross-sectional view taken along line I-I' of FIG. 7.

Referring to FIG. 8, a dielectric layer IOL may be disposed on the thin-film encapsulation layer TFE. The dielectric layer IOL may be an inorganic layer. At least one dielectric layer IOL may be provided on the thin-film encapsulation layer TFE. For example, two inorganic dielectric layers IOL may be sequentially stacked on the thin-film encapsulation layer TFE.

The connection pattern CP may be disposed on the dielectric layer IOL. A first dielectric layer TC-IL1 may be disposed on the connection pattern CP and the dielectric layer IOL. The first dielectric layer TC-IL1 may be an inorganic layer or an organic layer. The first sensing parts SP1 and the second sensing parts SP2 may be disposed on the first dielectric layer TC-IL1. The extension pattern EP unitarily formed with the second sensing parts SP2 may also be disposed on the first dielectric layer TC-IL1.

The connection pattern CP may be connected to the first sensing parts SP1 through a plurality of contact holes TC-CH defined in the first dielectric layer TC-IL1. The first dielectric layer TC-IL1 may be provided thereon with a second dielectric layer TC-IL2 that covers the first sensing parts SP1 and the second sensing parts SP2. The second dielectric layer TC-IL2 may be an organic layer.

Figure 9:
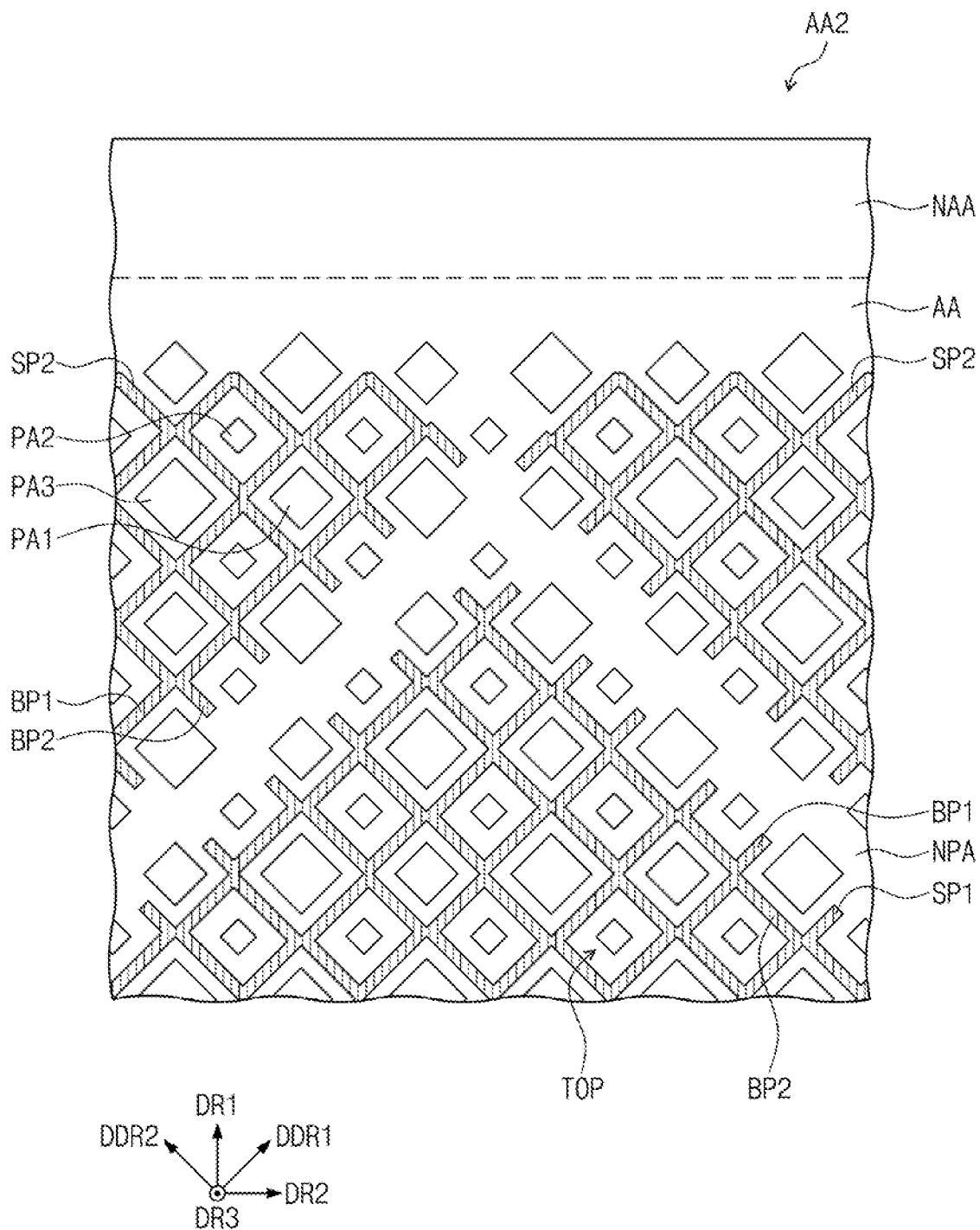
FIG. 9 is an enlarged view showing a second region AA2 depicted in FIG. 6.

FIG. 9 is an enlarged view showing a second region AA2 depicted in FIG. 6.

FIG. 9 exemplarily shows emission regions PA1, PA2, and PA3 together with the first and second sensing parts SP1 and SP2.

Referring to FIG. 9, the emission region PA shown in FIG. 5 may be one of the emission regions PA1, PA2, and PA3. The emission regions PA1, PA2, and PA3 may be arranged in the first and second diagonal directions DDR1 and DDR2. The first and second branches BP1 and BP2 may overlap the non-emission region NPA between the emission regions PA1, PA2, and PA3.

The emission regions PA1, PA2, and PA3 may include a plurality of first emission regions PA1 each of which displays a red color, a plurality of second emission regions PA2 each of which displays a green color, and a plurality of third emission regions PA3 each of which displays a blue color. In a plan view, the third emission region PA3 may be larger than the first emission region PA1, and the first emission region PA1 may be larger than the second emission region PA2.

The emission regions PA1, PA2, and PA3 may each have a rhombic shape, but the emission regions PA1, PA2, and PA3 may have other shapes. The touch openings TOP may overlap the emission regions PA1, PA2, and PA3. The touch openings TOP may have their rhombic shapes and sizes that correspond to those of the emission regions PA1, PA2, and PA3.

As the first and second sensing parts SP1 and SP2 are disposed on the non-emission region NPA, light generated from the emission regions PA1, PA2, and PA3 may be emitted normally without being affected by the first and second sensing parts SP1 and SP2.

Figure 10A:
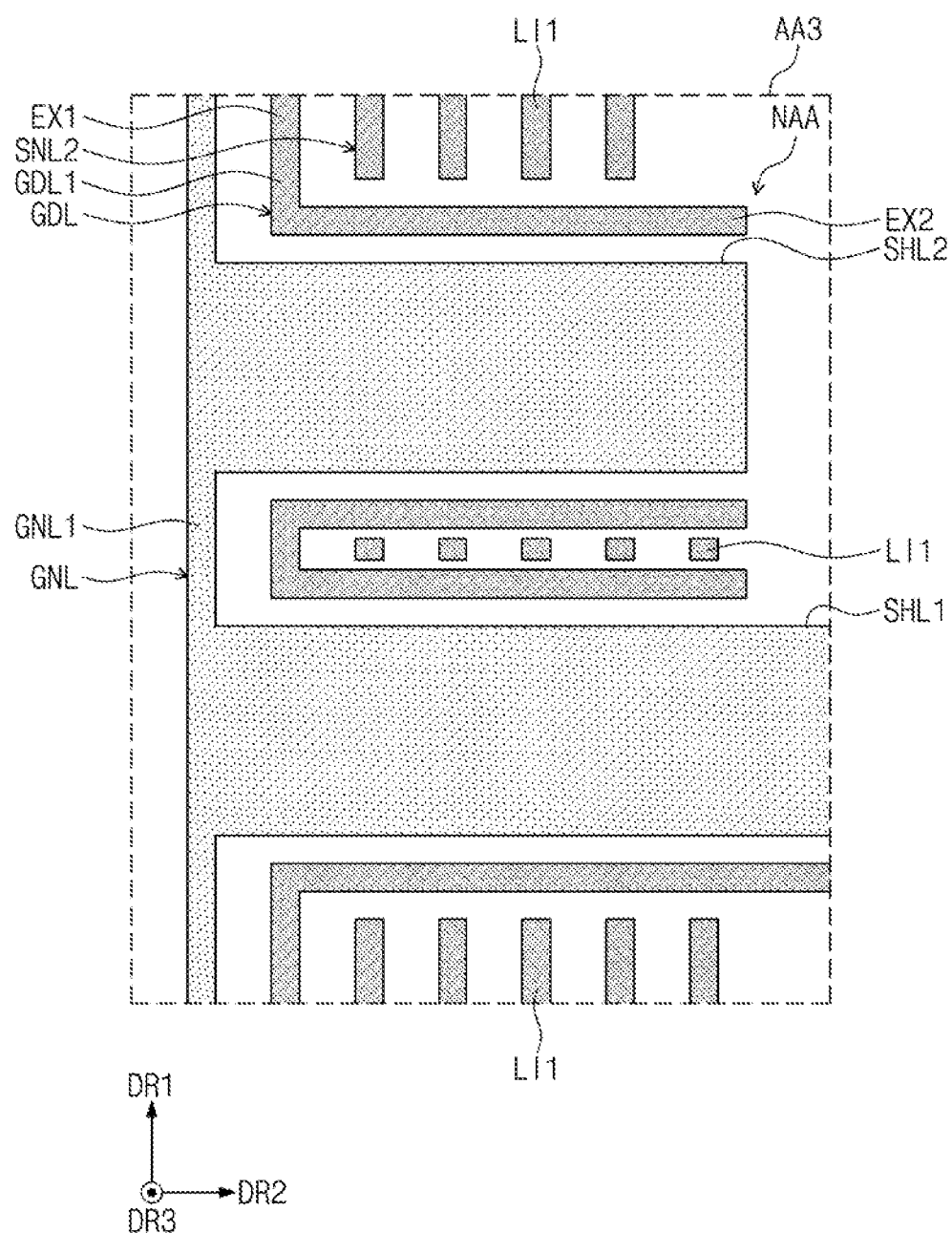
FIG. 10A is an enlarged plan view of a third region AA3 depicted in FIG. 6, showing first and second shield layers, a first ground line, a first guard line, and first wiring lines.
Figure 10B:
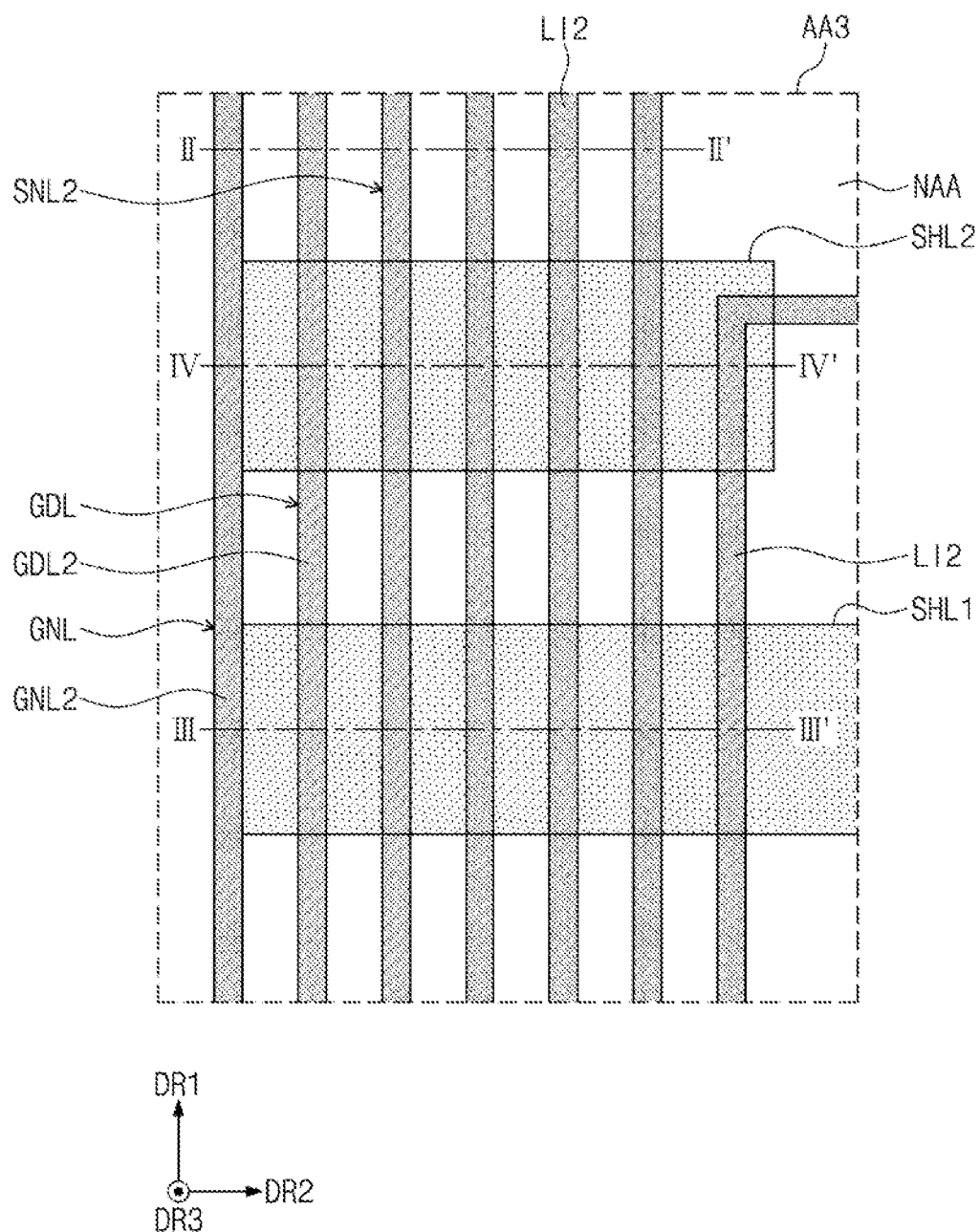
FIG. 10B is an enlarged plan view of a third region AA3 depicted in FIG. 6, showing first and second shield layers, a second ground line, a second guard line, and second wiring lines.
Figure 11:
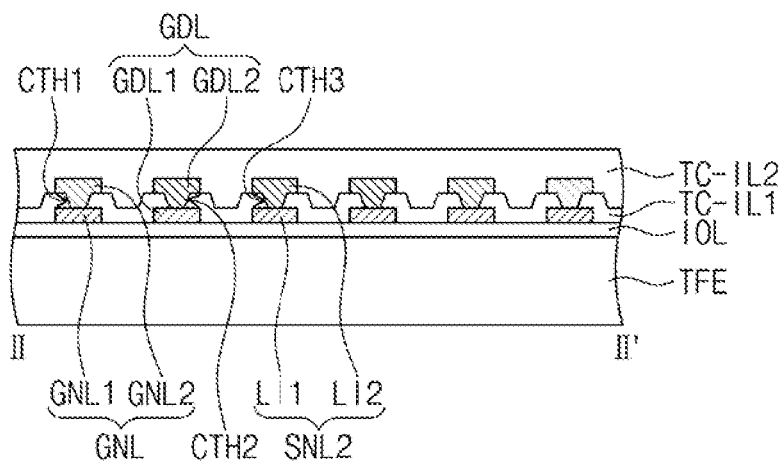
FIG. 11 is a cross-sectional view taken along line II-II' of FIG. 10B.
Figure 11:
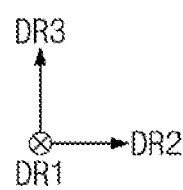
Figure 12:
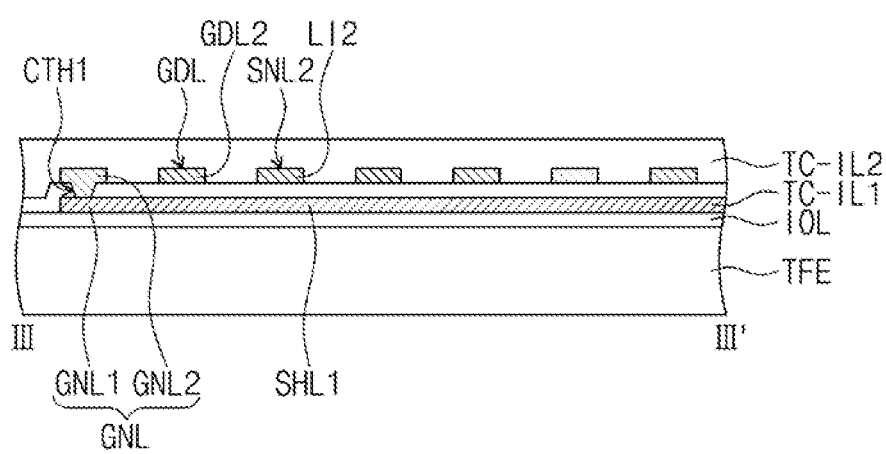
FIG. 12 is a cross-sectional view taken along line III-III' of FIG. 10B.
Figure 12:
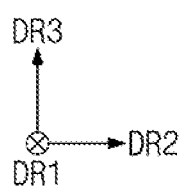
Figure 13:
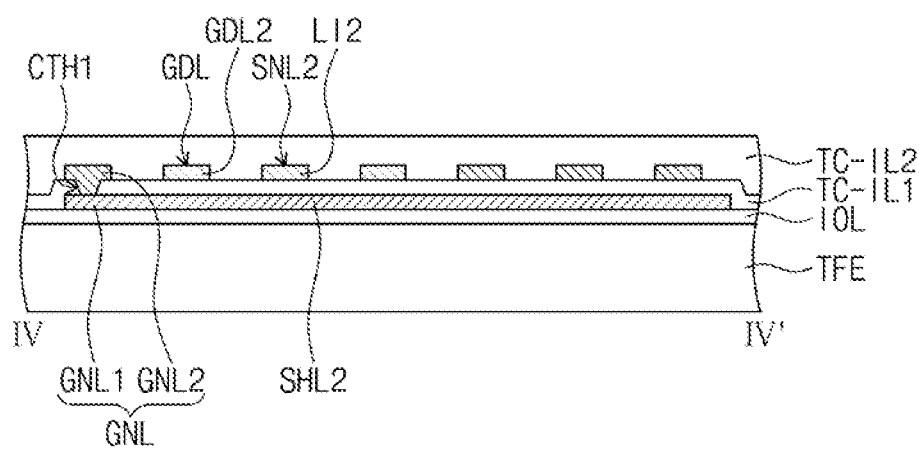
FIG. 13 is a cross-sectional view taken along line IV-IV' of FIG. 10B.

FIG. 10A is an enlarged plan view of a third region AA3 depicted in FIG. 6, showing first and second shield layers, a first ground line, a first guard line, and first wiring lines. FIG. 10B is an enlarged plan view of a third region AA3 depicted in FIG. 6, showing first and second shield layers, a second ground line, a second guard line, and second wiring lines. FIG. 11 is a cross-sectional view taken along line II-II' of FIG. 10B. FIG. 12 is a cross-sectional view taken along line of FIG. 10B. FIG. 13 is a cross-sectional view taken along line IV-IV' of FIG. 10B.

Referring to FIGS. 10A, 10B, and 11, the ground line GNL may include two wiring layers. For example, the ground line GNL may include a first ground line GNL1 and a second ground line GNL2 that is disposed on and connected to the first ground line GNL1.

The first ground line GNL1 may be disposed on the dielectric layer IOL. The second ground line GNL2 may be disposed on the first dielectric layer TC-IL1. The second ground line GNL2 may be connected to the first ground line GNL1 through a first contact hole CTH1 defined in the first dielectric layer TC-IL1. The second dielectric layer TC-IL2 may be disposed on the second ground line GNL2.

The guard line GDL may include two wiring layers. For example, the guard line GDL may include a first guard line GDL1 and a second guard line GDL2 that is disposed on and connected to the first guard line GDL1.

The first guard line GDL1 may be disposed on the dielectric layer IOL. The second guard line GDL2 may be disposed on the first dielectric layer TC-IL1. The second guard line GDL2 may be connected to the first guard line GDL1 through a second contact hole CTH2 defined in the first dielectric layer TC-IL1. The second dielectric layer TC-IL2 may be disposed on the second guard line GDL2.

The first guard line GDL1 may be located at the same level as that of the first ground line GNL1. The second guard line GDL2 may be located at the same level as that of the second ground line GNL2.

As illustrated in FIG. 10A, the first guard line GDL1 that extends in the first direction DR1 may turn to extend in the second direction DR2 at a location adjacent to the first and/or second shield layers SHL1 and SHL2. The first guard line GDL1 may include a first extension EX1 that extends in the first direction DR1 and a second extension EX2 that extends in the second direction DR2.

The first guard line GDL1 might not contact either the first shield layer SHL1 or the second shield layer SHL2. For example, the first guard line GDL1 may be spaced apart from the first and second shield layers SHL1 and SHL2 without overlapping the first shield layer SHL1 or the second shield layer SHL2. The first guard line GDL1 may be separated into a plurality of pieces that are spaced apart in the first direction DR1 from each other across the first and second shield layers SHL1 and SHL2.

The pieces of the first guard line GDL1 that are spaced apart from each other in the first direction DR1 may be connected through the second contact hole CTH2 to the second guard line GDL2. For example, the second guard line GDL2 may connect to each other the pieces of the first guard line GDL1 that are spaced apart from each other in the first direction DR1.

The second sensing line SNL2 may include two wiring layers. For example, each of the second sensing lines SNL2 may include a first wiring line LI1 and a second wiring line LI2 that is disposed on and connected to the first wiring line LI1.

The first wiring lines LI1 may be disposed on the dielectric layer IOL. The second wiring lines LI2 may be disposed on the first dielectric layer TC-IL1. The second wiring lines LI2 may be correspondingly connected to the first wiring lines LI1 through a plurality of third contact holes CTH3 defined in the first dielectric layer TC-IL1. The second dielectric layer TC-IL2 may be disposed on the second wiring lines LI2.

The second wiring lines LI2 may be located at the same level as that of the first and second sensing parts SP1 and SP2 and the extension patterns EP discussed above. The first wiring lines LI1 may be located at the same level as that of the connection patterns CP discussed above. The first wiring lines LI1 may be located at the same level as that of the first ground line GNL1 and the first guard line GDL1. The second wiring lines LI2 may be located at the same level as that of the second ground line GNL2 and the second guard line GDL2.

Likewise, the second sensing lines SNL2, the first sensing lines SNL1 may include first wiring lines LI1 and second wiring lines LI2 disposed on and connected to the first wiring line LI1.

As illustrated in FIG. 10A, the first wiring lines LI1 might not contact either the first shield layer SHL1 or the second shield layer SHL2. The first wiring lines LI1 may be spaced apart from the first and second shield layers SHL1 and SHL2 without overlapping the first shield layer SHL1 or the second shield layer SHL2. The first wiring lines LI1 may be spaced apart from the second extension EX2 without overlapping the second extension EX2. The second extension EX2 may be disposed between the first wiring lines LI1 and the first shield layer SHL1 and between the first wiring lines LI1 and the second shield layer SHL2.

Each of the first wiring lines LI1 may be separated into a plurality of pieces that are spaced apart in the first direction DR1 from each other across the first and second shield layers SHL1 and SHL2. The pieces of the first wiring lines LI1 that are spaced apart from each other in the first direction DR1 may be connected through the third contact holes CTH3 to a corresponding one of the second wiring lines LI2. For example, the second wiring line LI2 may connect to each other the pieces of the first wiring lines LI1 that are spaced apart from each other in the first direction DR1.

Referring to FIGS. 10A, 10B, 12, and 13, the second wiring lines LI2 may extend to intersect the first and second shield layers SHL1 and SHL2 while being insulated from the first and second shield layers SHL1 and SHL2. The second guard line GDL2 may extend to intersect the first and second shield layers SHL1 and SHL2 while being insulated from the first and second shield layers SHL1 and SHL2.

The first shield layer SHL1 may extend from the first ground line GNL1 and may be disposed below the second guard line GDL2 and the second wiring lines LI2. The second shield layer SHL2 may extend from the first ground line GNL1 and may be disposed below the second guard line GDL2 and the second wiring lines LI2. The second guard line GDL2 and the second wiring lines LI2 may be disposed on the first and second shield layers SHL1 and SHL2.

On the inactive region NAA where the first and second shield layers SHL1 and SHL2 are disposed, the second sensing lines SNL2 may include the second wiring lines LI2, but might not include the first wiring lines LI1. For example, the first wiring lines LI1 might not be disposed on the inactive region NAA where the first and second shield layers SHL1 and SHL2 are disposed. As illustrated in FIG. 11, on the inactive region NAA where neither of the first and second shield layers SHL1 and SHL2 are disposed, the second sensing lines SNL2 may include the first wiring lines LI1 and the second wiring lines LI2.

On the inactive region NAA where the first and second shield layers SHL1 and SHL2 are disposed, the guard line GDL may include the second guard line GDL2, but might not include the first guard line GDL1. The first guard line GDL1 might not be disposed on the inactive region NAA where the first and second shield layers SHL1 and SHL2 are disposed. As illustrated in FIG. 11, on the inactive region NAA where neither of the first and second shield layers SHL1 and SHL2 are disposed, the guard line GDL may include the first guard line GDL1 and the second guard line GDL2.

Figure 14:
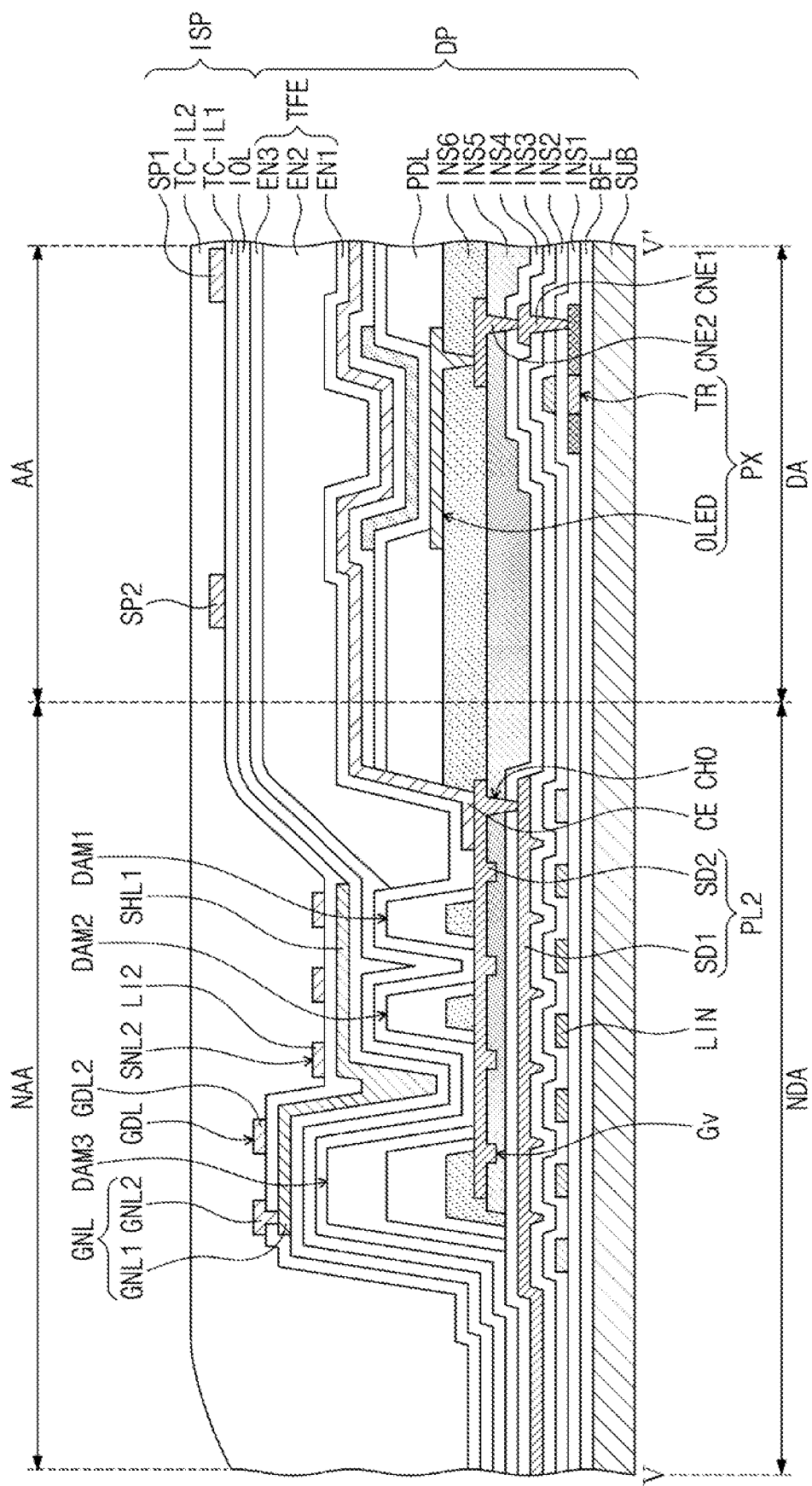
FIG. 14 is a cross-sectional view taken along line V-V' of FIG. 6.

FIG. 14 is a cross-sectional view taken along line V-V' of FIG. 6.

FIG. 14 exemplarily shows a cross-sectional configuration of the first shield layer and the second sensing lines disposed on the first shield layer.

FIG. 14 exemplarily shows the first shield layer SHL1 together with the pixel PX disposed on the display area DA and with the first and second sensing parts SP1 and SP2 disposed on the active region AA. In addition, three second sensing lines SNL2 are also exemplarily illustrated.

Referring to FIG. 14, a plurality of wiring patterns LIN may be disposed on the non-display area NDA. The wiring patterns LIN may be disposed on the first dielectric layer INS1, and the second dielectric layer INS2 may be disposed on the wiring patterns LIN. The wiring patterns LIN may form the first and second control lines CSL1 and CSL2 and the data lines DL1 to DLn depicted in FIG. 4.

The second power line PL2 may include a first electrode SD1 and a second electrode SD2. The first electrode SD1 may be disposed on the third dielectric layer INS3, and the second electrode SD2 may be disposed on the fifth dielectric layer INS5. A plurality of grooves GV may be defined on a top surface of the fifth dielectric layer INS5 disposed below the second electrode SD2. The second electrode SD2 may be disposed in the grooves GV. Because the second electrode SD2 is disposed in the grooves GV, it may be possible to expand a zone where the second electrode SD2 is disposed.

The first electrode SD1 may be located at the same level as that of the first connection electrode CNE1, and the second electrode SD2 may be located at the same level as that of the second connection electrode CNE2. The second electrode SD2 may be electrically connected to the first electrode SD1 through a contact hole CHO defined in the fourth and fifth dielectric layers INS4 and INS5.

The sixth dielectric layer INS6 and the pixel definition layer PDL may be disposed onto the non-display area NDA adjacent to the display area DA. The second electrode CE of the light emitting element OLED may extend along lateral surfaces of the sixth dielectric layer INS6 and the pixel definition layer PDL, and may be disposed on the second electrode SD2 adjacent to the display area DA. The second electrode CE may be electrically connected to the second electrode SD2.

A second voltage may be applied to the first electrode SD1, the second electrode SD2, and the second electrode CE. The second voltage may be instantiated as a common voltage. The second electrode CE may be disposed on an entirety of the display area DA.

When the pixel PX operates, signals applied to wiring lines connected to the transistor TR may affect signals applied to the first and second sensing parts SP1 and SP2. The signal interference mentioned above may cause the occurrence of noise in the input sensing part ISP. In contrast, in an embodiment of the present invention, the second electrode CE to which the common voltage is applied may be disposed on the entirety of the display area DA, which may result in blocking of the signal interference. As a result, noise of the input sensing part ISP may be reduced.

On the non-display area NDA, the first, second, and third dams DAM1, DAM2, and DAM3 may be disposed on the fifth dielectric layer INS5. The first, second, and third dams DAM1, DAM2, and DAM3 may be placed on the second electrode SD2.

The first, second, and third dams DAM1, DAM2, and DAM3 may be spaced apart from each other. The first dam DAM1 may be closer than the second and third dams DAM2 and DAM3 to the display area DA. The third dam DAM3 may be farther from the display area DA than the first and second dams DAM1 and DAM2. Therefore, the second dam DAM2 may be disposed between the first dam DAM1 and the third dam DAM3.

Each of the first, second, and third dams DAM1, DAM2, and DAM3 may include a plurality of stacked layers. For example, the third dam DAM3 may have a height greater than those of the first and second dams DAM1 and DAM2, and the height of the first dam DAM1 may be the same as the height of the second dam DAM2. However, the heights of the first, second, and third dams DAM1, DAM2, and DAM3 are not necessarily limited to the arrangement discussed above.

The first and second dams DAM1 and DAM2 may be formed of the same material as that of the sixth dielectric layer INS6 and the pixel definition layer PDL. The third dam DAM3 may be formed of the same material as that of the sixth dielectric layer INS6 and the pixel definition layer PDL, and may further include a dielectric layer (not designated by a reference numeral) that is additionally disposed on the pixel definition layer PDL.

The thin-film encapsulation layer TFE covering the pixel PX may extend toward the non-display area NDA, and may be disposed on the second electrode SD2, the first, second, and third dams DAM1, DAM2, and DAM3, and the fourth dielectric layer INS4.

The first encapsulation layer EN1 disposed on the pixel PX may extend toward the non-display area NDA, and may be disposed on the second electrode SD2, the first, second, and third dams DAM1, DAM2, and DAM3, and the fourth dielectric layer INS4. The second encapsulation layer EN2 may be disposed onto the non-display area NDA adjacent to the display area DA. The second encapsulation layer EN2 may be disposed onto the first dam DAM1. The third encapsulation layer EN3 may be disposed on the first encapsulation layer EN1 so as to cover the second encapsulation layer EN2.

The first, second, and third dams DAM1, DAM2, and DAM3 may demarcate a zone where is formed the second encapsulation layer EN2 including an organic material. An organic material having fluidity may be cured to form the second encapsulation layer EN2. Even when an organic material having fluidity flows toward the non-display area NDA, the first dam DAM1 may block the flow of the organic material. The second and third dams DAM2 and DAM3 may additionally block the organic material that flows over the first dam DAM1.

On the inactive region NAA, the thin-film encapsulation layer TFE may be provided thereon with the ground line GNL, the first shield layer SHL1, the guard line GDL, and the second sensing lines SNL2. The first shield layer SHL1 may be disposed on the second electrode SD2 and the wiring patterns LIN. In addition, the first shield layer SHL1 may be disposed on the first, second, and third dams DAM1, DAM2, and DAM3. In a plan view, the first shield layer SHL1 may overlap the second electrode SD2 and the first, second, and third dams DAM1, DAM2, and DAM3.

Signals applied to the wiring patterns LIN may adversely affect signals applied to the second sensing lines SNL2, and thus it may be possible to distort the signals applied to the second sensing lines SNL2. The signals applied to the wiring patterns LIN may also adversely affect signals applied to the first sensing lines SNL1.

The second electrode SD2 may be used to prevent the signal interference mentioned above. The second electrode SD2 may be disposed between the wiring patterns LIN and the second sensing lines SNL2, and may thus block the signal interface discussed above. Moreover, the second electrode SD2 may also be disposed between the wiring patterns LIN and the first sensing lines SNL1 depicted in FIG. 6, and may thus block the signal interface discussed above.

The first shield layer SHL1 may be disposed between the wiring patterns LIN and the second sensing lines SNL2, and may thus block the signal interface discussed above. Moreover, the first shield layer SHL1 may also be disposed between the wiring patterns LIN and the first sensing lines SNL1 depicted in FIG. 6, and may thus block the signal interface discussed above. Therefore, the first shield layer SHL1 may satisfactorily block the signal interference.

The second dielectric layer TC-IL2 may be disposed on the first shield layer SHL1, the second sensing lines SNL2, the ground line GNL, the guard line GDL, and the first and second sensing parts SP1 and SP2. The second dielectric layer TC-IL2 may provide a flat top surface on the first shield layer SHL1, the second sensing lines SNL2, the ground line GNL, the guard line GDL, and the first and second sensing parts SP1 and SP2.

The second dielectric layer TC-IL2 that passes over the third dam DAM3 may become crooked and point downwardly due to a step difference formed caused by the third dam DAM3. Nevertheless, the second dielectric layer TC-IL2 may provide a flat top surface up to an edge of the substrate SUB.

Figure 15:
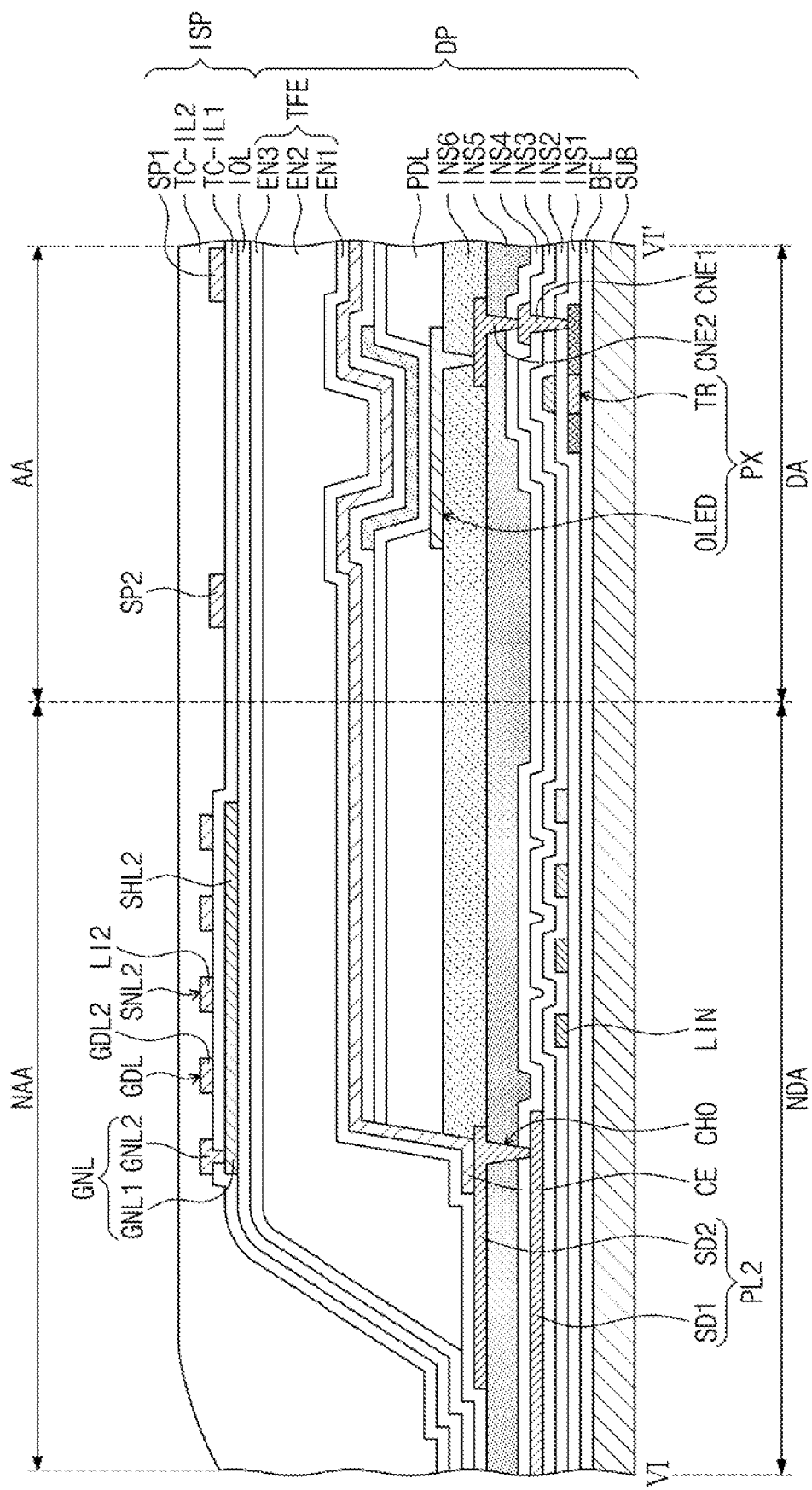
FIG. 15 is a cross-sectional view taken along line VI-VI' of FIG. 6.

FIG. 15 is a cross-sectional view taken along line VI-VI' of FIG. 6.

FIG. 15 exemplarily shows a cross-sectional configuration of the second shield layer and the second sensing lines disposed on the second shield layer.

FIG. 15 depicts, by way of example, three second sensing lines SNL2.

Referring to FIG. 15, the first electrode SD1, the second electrode SD2, and the second electrode CE may be connected to each other. The structure where the first electrode SD1, the second electrode SD2, and the second electrode CE are connected to each other is substantially the same as that discussed in FIG. 14, and thus to the extent that a description of these structure are omitted, it may be assumed that these structures are at least similar to corresponding structures described previously.

The thin-film encapsulation layer TFE may be provided with the ground line GNL, the first shield layer SHL1, the guard line GDL, and the second sensing lines SNL2 disposed thereon. The second electrode CE may be disposed on wiring patterns LIN. The wiring patterns LIN illustrated in FIG. 15 may form elements of the scan driver SDV shown in FIG. 4.

The second electrode CE may be disposed between the wiring patterns LIN and the second sensing lines SNL2, thereby blocking signal interface between the wiring patterns LIN and the second sensing lines SNL2. In addition, the second shield layer SHL2 may be disposed between the wiring patterns LIN and the second sensing lines SNL2, and may thus block the signal interface discussed above. Therefore, the second shield layer SHL2 may satisfactorily block the signal interference.

Figure 16:
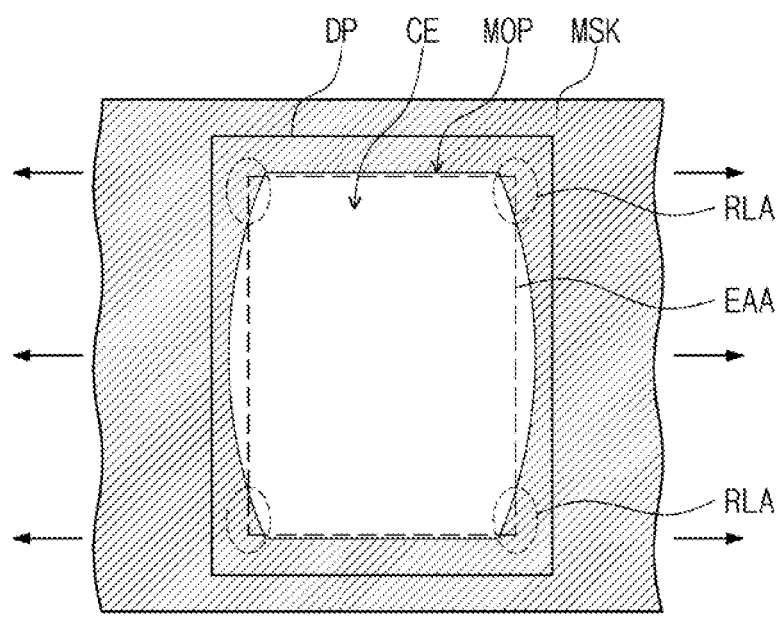
FIG. 16 is a plan view showing a zone where is formed a second electrode of a light emitting element in a display panel.

FIG. 16 is a plan view showing a zone where the second electrode of the light emitting element in the display panel is formed.

Referring to FIG. 16, when the display panel DP is fabricated, a mask MSK may be used to form the second electrode CE depicted in FIG. 5. The mask MSK may be disposed on the substrate SUB, and an opening MOP defined in the mask MSK may be used to provide the substrate SUB with a material for forming the second electrode CE. In FIG. 16, a rectangular zone illustrated in a dotted line may be defined as a deposition region EAA where the second electrode CE will be formed. The deposition region EAA may be greater than the display area DA depicted in FIG. 4.

The mask MSK may be laterally stretched to spread flat. When the mask MSK stretches, the opening MOP may be deformed. In this case, the second electrode CE might not be formed on top-side left and right areas RLA of the deposition region EAA or bottom-side left and right areas RLA of the deposition region EAA. Therefore, no signal interference may be blocked on a location where the second electrode CE is not formed.

As illustrated in FIG. 6, in an embodiment of the present invention, signal interference may be blocked by the second shield layers SHL2 disposed on locations where the second electrode CE might not be formed.

Figure 17:
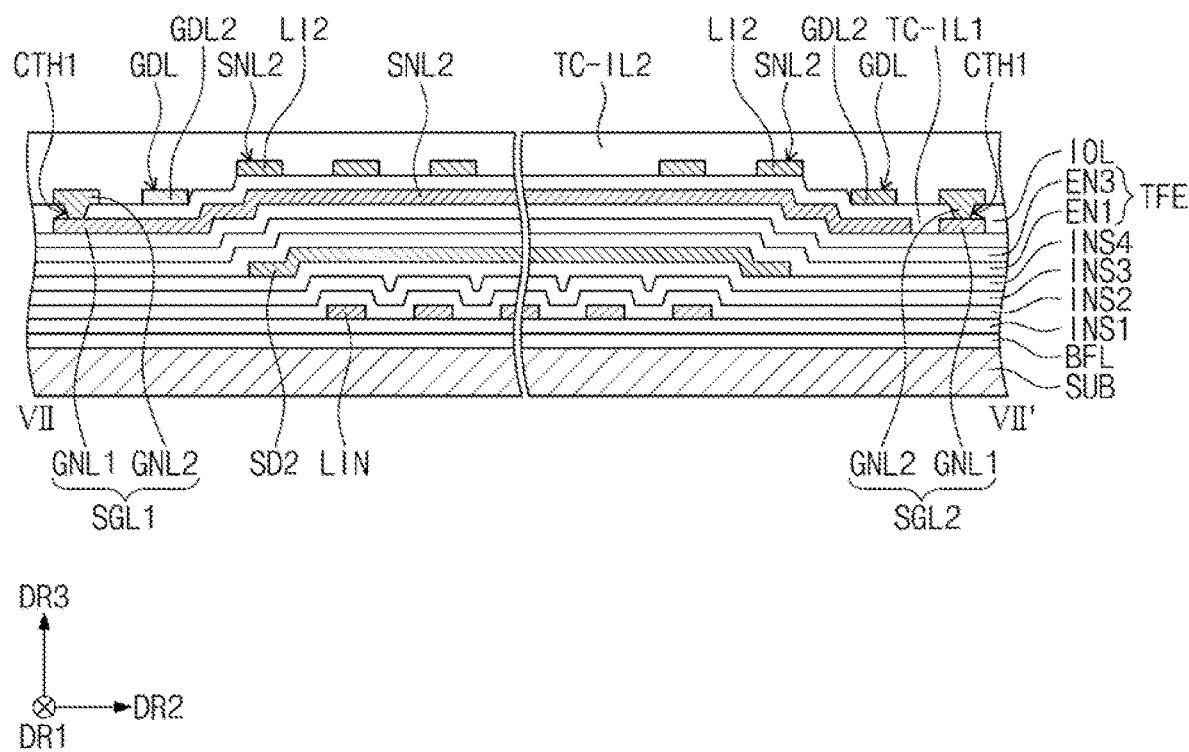
FIG. 17 is a cross-sectional view taken along line VII-VII' of FIG. 6.

FIG. 17 is a cross-sectional view taken along line VII-VII' of FIG. 6.

Referring to FIG. 17, the second electrode SD2 may be disposed on the wiring patterns LIN, and the first and second sensing lines SNL1 and SNL2 may be disposed on the second electrode SD2. The second electrode SD2 may be disposed on the fourth dielectric layer INS4.

Each of the first and second sub-ground lines SGL1 and SGL2 may include the first ground line GNL1 and the second ground line GNL2 that is disposed on the first ground line GNL1 and is connected through the first contact hole CTH1 to the first ground line GNL1. The first shield layer SHL1 that extends from the first ground line GNL1 of the first sub-ground line SGL1 may extend toward the second sub-ground line SGL2.

The first shield layer SHL1 may be disposed below the second wiring lines LI2 of the first and second sensing lines SNL1 and SNL2 and below the second guard line GDL2 of the guard line GDL. The first shield layer SHL1 may be adjacent to the first ground line GNL1 of the second sub-ground line SGL2. The first shield layer SHL1 may be spaced apart from the first ground line GNL1 of the second sub-ground line SGL2 without being connected to the first ground line GNL1 of the second sub-ground line SGL2.

Figure 18:
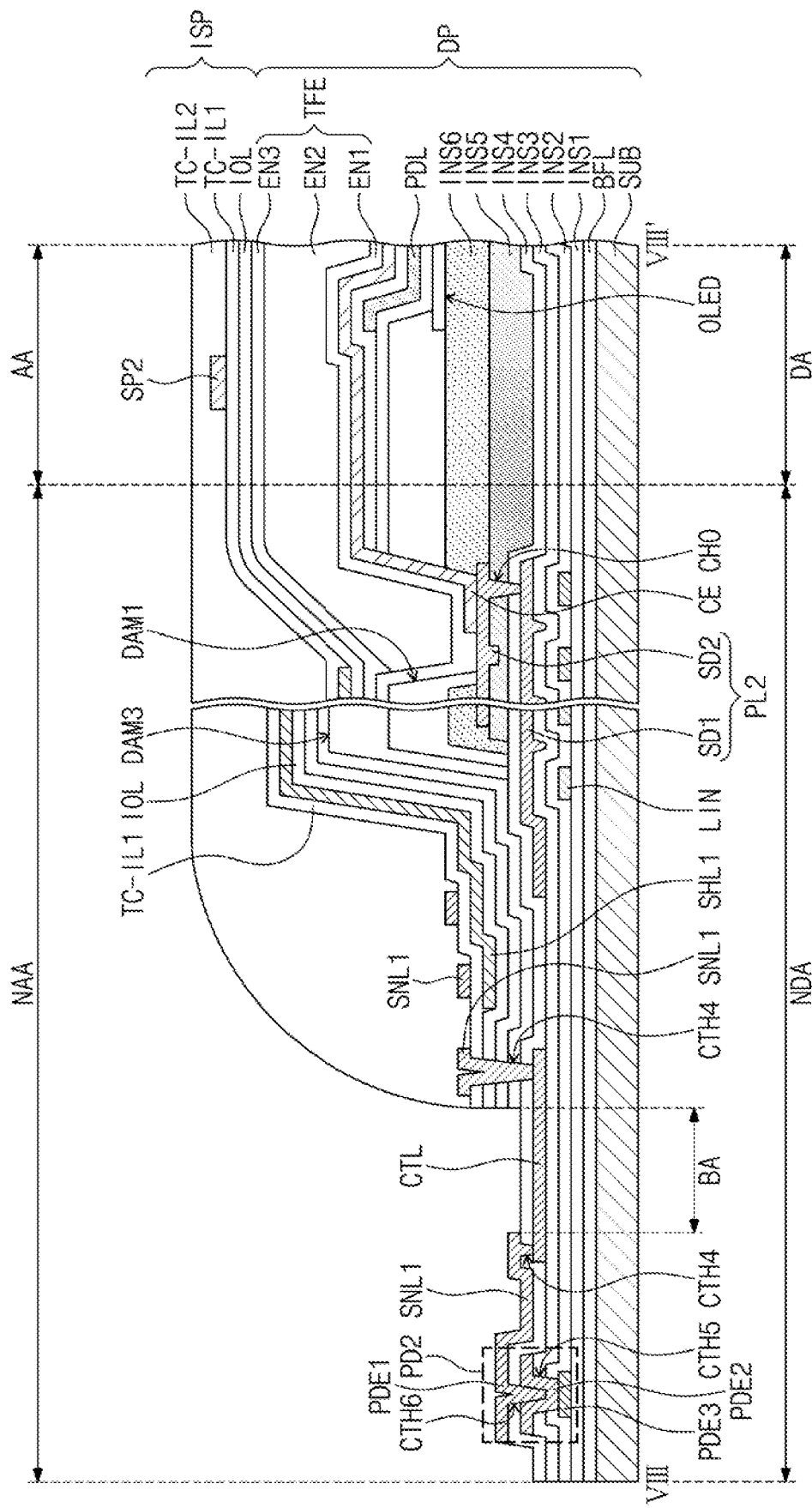
FIG. 18 is a cross-sectional view taken along line VIII-VIII' of FIG. 6.

FIG. 18 is a cross-sectional view taken along line VIII-VIII' of FIG. 6.

Referring to FIG. 18, a bending region BA may be defined on the substrate SUB. The bending region BA may be disposed between the display area DA and the second pad PD2. The first and third encapsulation layers EN1 and EN3, the dielectric layer IOL, the first dielectric layer TC-IL1, and the second dielectric layer TC-IL2 may be disposed onto the bending region BA. The fourth dielectric layer INS4 may extend toward the edge of the substrate SUB after passing through the bending region BA.

The first shield layer SHL1 may pass over the third dam DAM3 and may extend toward the inactive region NAA, thereby being disposed on the dielectric layer IOL. The first shield layer SHL1 may be spaced apart from the bending region BA.

The first sensing line SNL1 may extend toward the edge of the substrate SUB and may have connection with the second pad PD2. For example, the first sensing line SNL1 may be separated from the bending region BA. The first sensing lines SNL1 separated from the bending region BA may be connected to each other through a connection electrode CTL The connection electrode CTL may be disposed on the third dielectric layer INS3, and the fourth dielectric layer INS4 may be disposed on the third dielectric layer INS3 so as to cover the connection electrode CTL. The connection electrode CTL may be a portion of the first sensing line SNL1 that, as shown in FIG. 6, turns from the second direction DR2 to the first direction DR1 to extend toward the second pad PD2. The connection electrode CTL may be formed of the same material as that of the second electrode SD2 and may be located at the same level as that of the second electrode SD2. The connection electrode CTL might not be externally exposed.

Fourth contact holes CTH4 may be defined on locations adjacent to the bending region BA. The fourth contact hole CTH4 adjacent to a right-side of the bending region BA may penetrate the fourth dielectric layer INS4, the first and third encapsulation layers EN1 and EN3, the dielectric layer IOL, and the first dielectric layer TC-IL1. The fourth contact hole CTH4 adjacent to a left-side of the bending region BA may penetrate the fourth dielectric layer INS4. The first sensing lines SNL1 separated from the bending region BA may be connected through the fourth contact holes CTH4 to the connection electrode CTL.

The first sensing line SNL1 connected to the connection electrode CTL may extend toward and connection with the second pad PD2. The second pad PD2 may include a first pad electrode PDE1, a second pad electrode PDE2 disposed below the first pad electrode PDE1, and a third pad electrode PDE3 disposed below the second pad electrode PDE2. The first pad electrode PDE1 may be instantiated as a portion of the first sensing line SNL1, which portion is adjacent to an end of the first sensing line SNL1.

The second pad electrode PDE2 may be formed of the same material as that of the second electrode SD2 and may be located at the same level as that of the second electrode SD2. The third pad electrode PDE3 and the gate G depicted in FIG. 5 may be formed of the same material at the same time and may be located at the same level. The third pad electrode PDE3 may be omitted.

The second pad electrode PDE2 may be connected to the third pad electrode PDE3 through a fifth contact hole CTH5 defined in the second and third dielectric layers INS2 and INS3. The first pad electrode PDE1 may be connected to the second pad electrode PDE2 through a sixth contact hole CTH6 defined in the fourth dielectric layer INS4.

It has exemplarily been explained a structure in which the first signal line SNL1 and the second pad PD2 are connected to each other, and the second sensing line SNL2 and the third pad PD3 may be connected substantially similarly to the second sensing line SNL2 and the third pad PD3.

The bending region BA may be bent to dispose the second pad PD2 below the substrate SUB. Therefore, when the display device DD is viewed from above, the second pad PD2 might not be externally visible.

The bending region BA and the second pad PD2 may further be provided therebetween with a protection layer on the first sensing line SNL1 and the bending region BA. The protection layer may protect the first sensing line SNL1 and the connection electrode CTL, and may protect the bending region BA against external impact.

Figure 19:
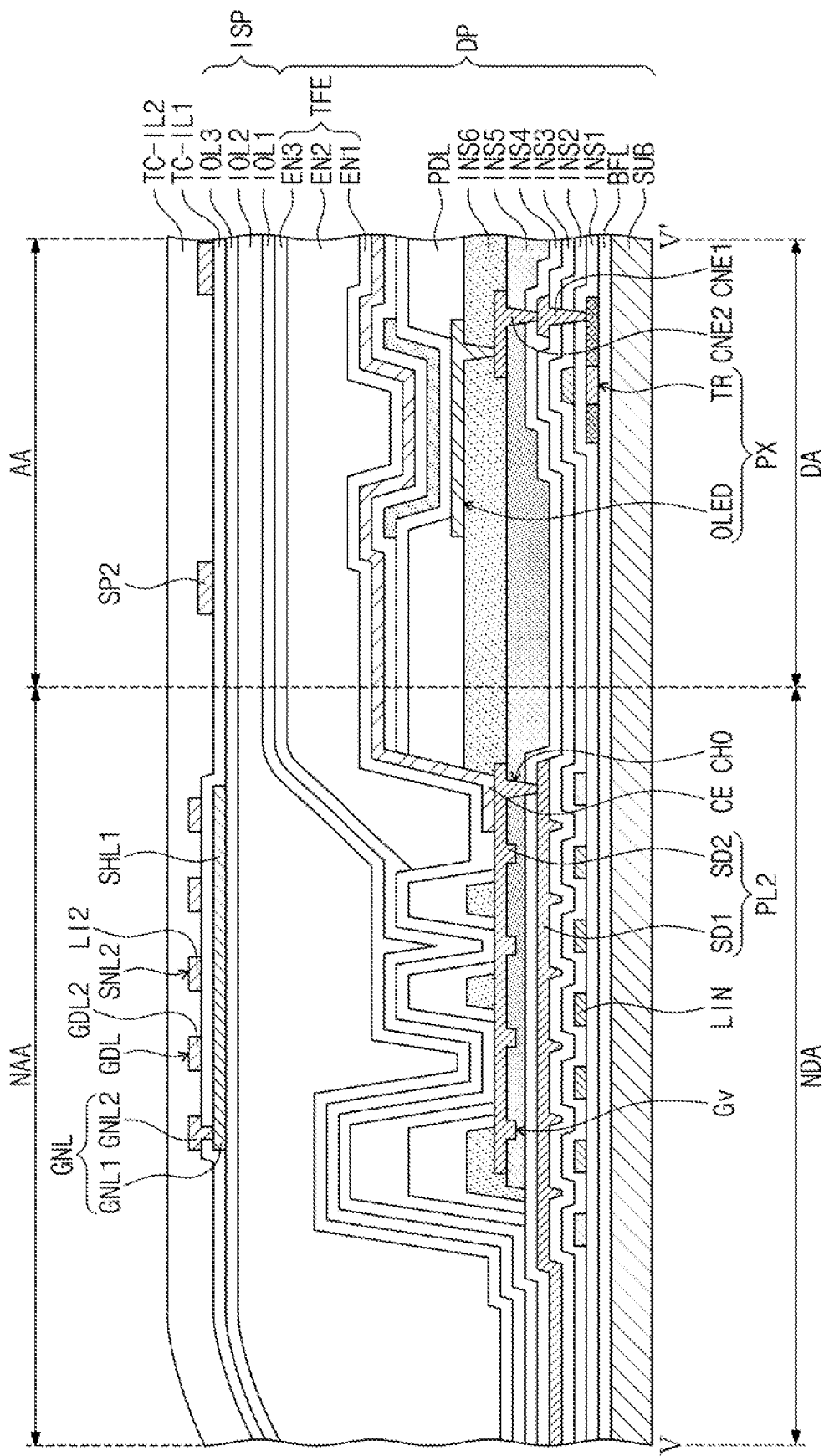
FIG. 19 is a cross-sectional view showing a display device according to an embodiment of the present invention.

FIG. 19 is a cross-sectional view showing a display device according to an embodiment of the present invention.

FIG. 19 exemplarily shows a cross-section corresponding to that of FIG. 14.

Referring to FIG. 19, a first dielectric layer IOL1 may be disposed on the third encapsulation layer EN3, a second dielectric layer IOL2 may be disposed on the first dielectric layer IOL1, and a third dielectric layer IOL3 may be disposed on the second dielectric layer IOL2. The first and third dielectric layers IOL1 and IOL3 may be inorganic layers, and the second dielectric layer IOL2 may be an organic layer. The third dielectric layer IOL3 may be provided thereon with the ground line GNL, the guard line GDL, the second sensing lines SNL2, and the first shield layer SHL1.

The second dielectric layer IOL2 may provide a flat top surface on the thin-film encapsulation layer TFE and the dams DAM1, DAM2, and DAMS. Therefore, the ground line GNL, the guard line GDL, the second sensing lines SNL2, and the first shield layer SHL1 may be disposed on a flat top surface of the third dielectric layer IOL3, which flat top surface is formed by the second dielectric layer IOL2.

The configuration depicted in FIG. 19 is the same as that of FIG. 14, and thus to the extent that a description of these structure are omitted, it may be assumed that these structures are at least similar to corresponding structures described previously.

FIGS. 20 to 27 illustrate plan and cross-sectional views showing shield layers according to some embodiments of the present invention.

In the embodiments of FIGS. 20 to 27, the following description will focus on different configurations from those of FIG. 6, and the same components will be allocated the same reference numerals.

Figure 20:
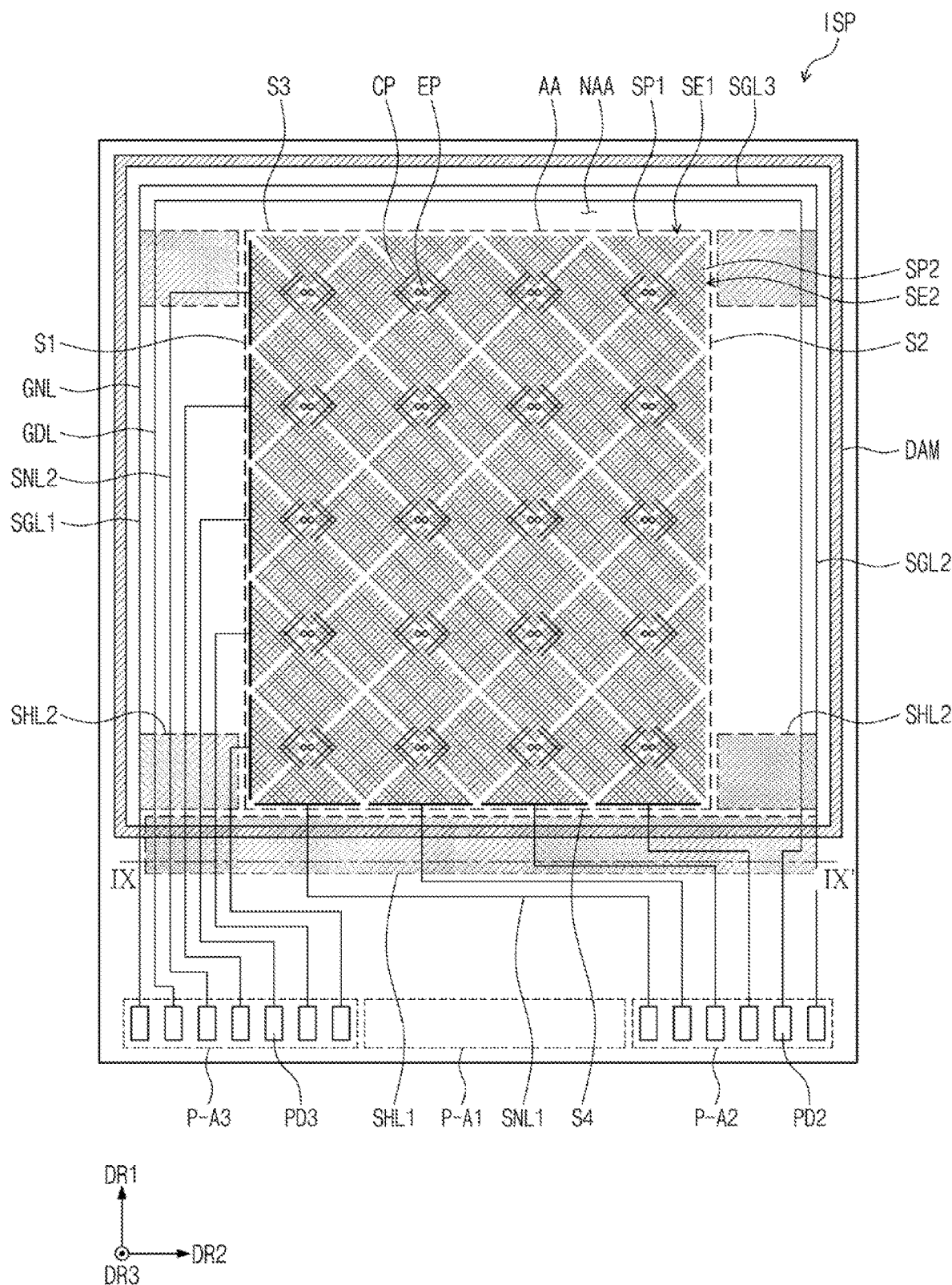
FIGS. 20 to 27 are plan and cross-sectional views showing shield layers according to some embodiments of the present invention.
Figure 21:
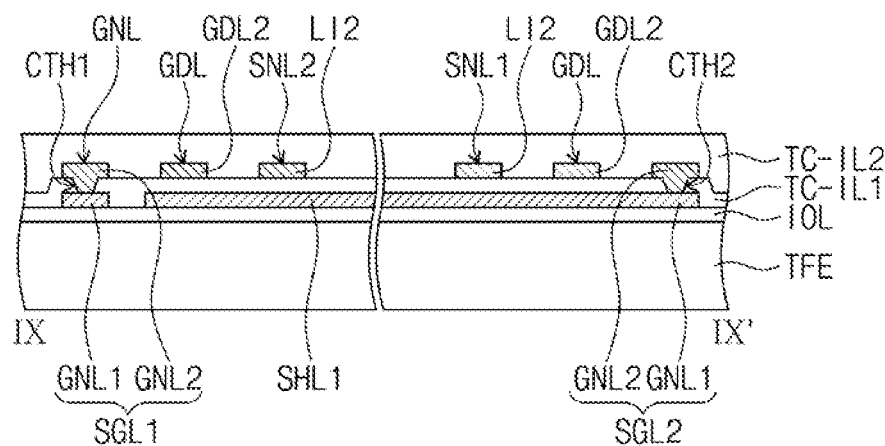

FIG. 20 shows shield layers according to some embodiments of the present invention. FIG. 21 is a cross-sectional view taken along line IX-IX' of FIG. 20.

FIG. 21 omits an exemplary illustration of a configuration below the thin-film encapsulation layer TFE, and the configuration below the thin-film encapsulation layer TFE may be the same as that of FIG. 17. Although a single layer is illustrated for convenience of description, the thin-film encapsulation layer TFE depicted in FIG. 21 may include the first and third encapsulation layers EN1 and EN3 shown in FIG. 17.

Referring to FIGS. 20 and 21, differently from the configuration of FIG. 6, the first shield layer SHL1 may extend from the second sub-ground line SGL2. The first shield layer SHL1 may be adjacent to the first sub-ground line SGL1. The first shield layer SHL1 may be spaced apart from the first sub-ground line SGL1 without being connected to the first sub-ground line SGL1.

For example, the first shield layer SHL1 may extend from the first ground line GNL1 of the second sub-ground line SGL2. The first shield layer SHL1 may extend toward the first sub-ground line SGL1. The first shield layer SHL1 may be disposed below the second wiring lines LI2 of the first and second sensing lines SNL1 and SNL2 and below the second guard line GDL2 of the guard line GDL.

The first shield layer SHL1 may be adjacent to the first ground line GNL1 of the first sub-ground line SGL1. The first shield layer SHL1 may be spaced apart from the first ground line GNL1 of the first sub-ground line SGL1 without being connected to the first ground line GNL1 of the first sub-ground line SGL1.

Figure 22:
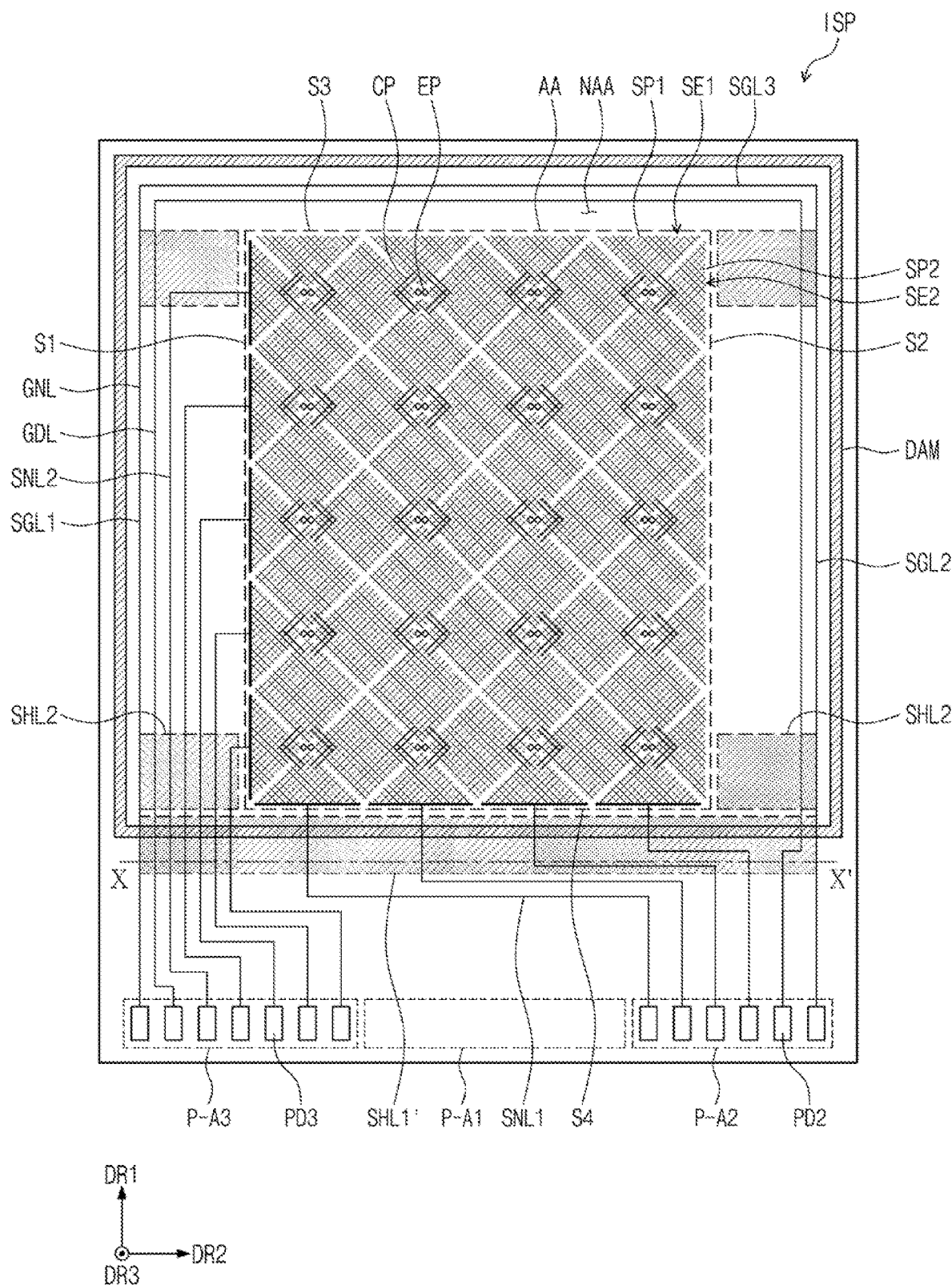
Figure 23:
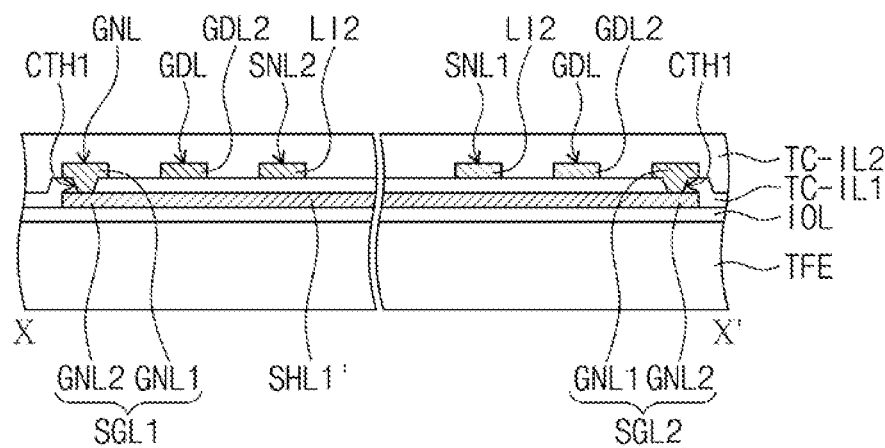

FIG. 22 shows shield layers according to some embodiments of the present invention. FIG. 23 is a cross-sectional view taken along line X-X' of FIG. 22.

Likewise, FIG. 21, FIG. 23 omits an exemplary illustration of a configuration below the thin-film encapsulation layer TFE, and the thin-film encapsulation layer TFE is illustrated as a single layer for convenience of description.

Referring to FIGS. 22 and 23, differently from the configuration of FIG. 6, a first shield layer SHL1' may extend from the first sub-ground line SGL1 and the second sub-ground line SGL2.

For example, the first shield layer SHL1' may extend from the first ground line GNL1 of the first sub-ground line SGL1 and from the second ground line GNL2 of the second sub-ground line SGL2. The first shield layer SHL1' may be disposed below the second wiring lines LI2 of the first and second sensing lines SNL1 and SNL2 and below the second guard line GDL2 of the guard line GDL.

Figure 24:
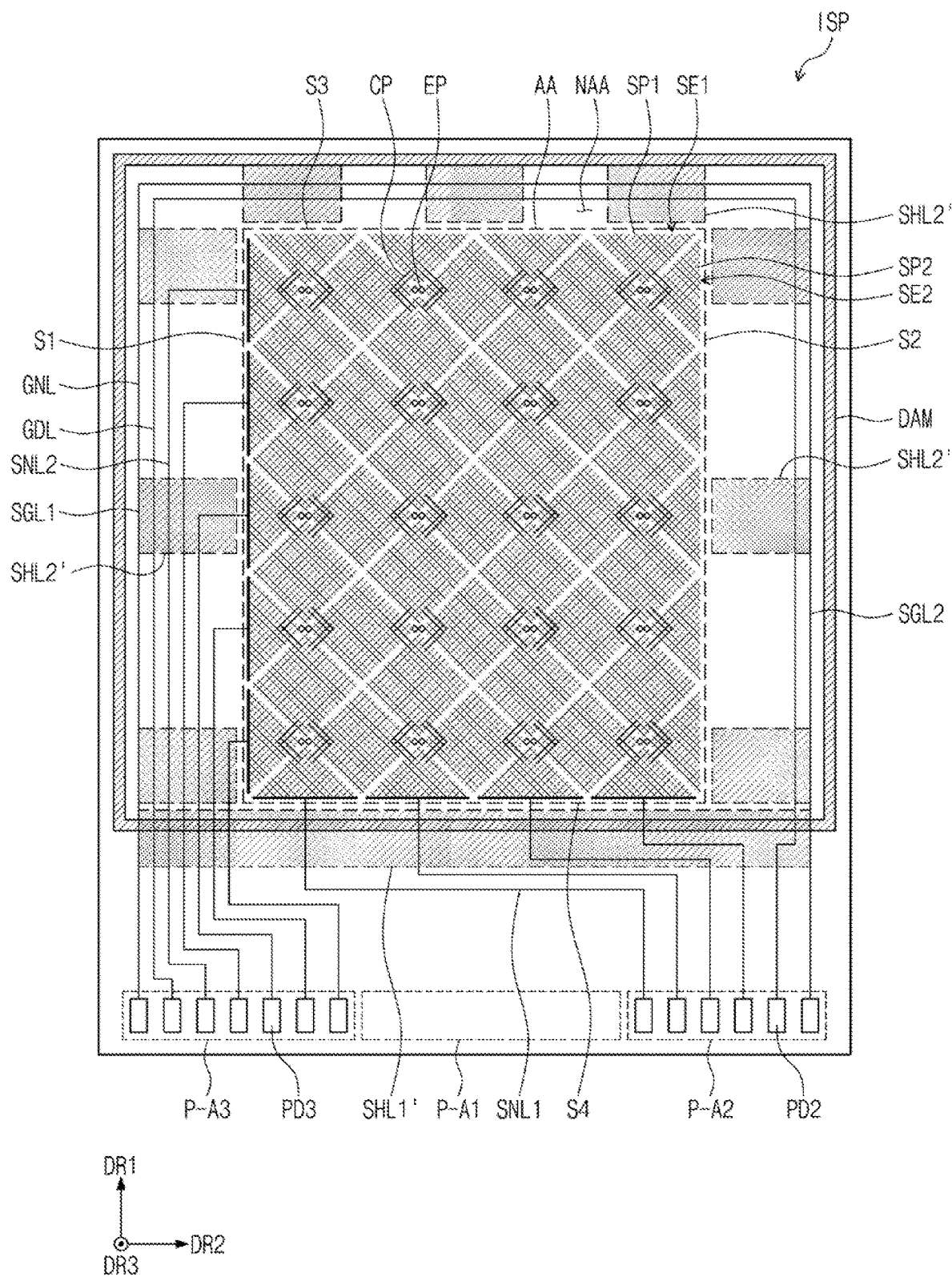

FIG. 24 shows shield layers according to some embodiments of the present invention.

Referring to FIG. 24, second shield layers SHL2' may extend toward and may be adjacent to the first side S1, the second side S2, and the third side S3.

The second shield layers SHL2' adjacent to the first side S1 may be disposed at a regular interval in the first direction DR1. The second shield layers SHL2' adjacent to the second side S2 may be disposed at a regular interval in the first direction DR1. The second shield layers SHL2' adjacent to the third side S3 may be disposed at a regular interval in the second direction DR2.

However, the interval between the second shield layers SHL2' may be different from what is described herein. For example, the second shield layers SHL2' may be disposed at an irregular interval.

Figure 25:
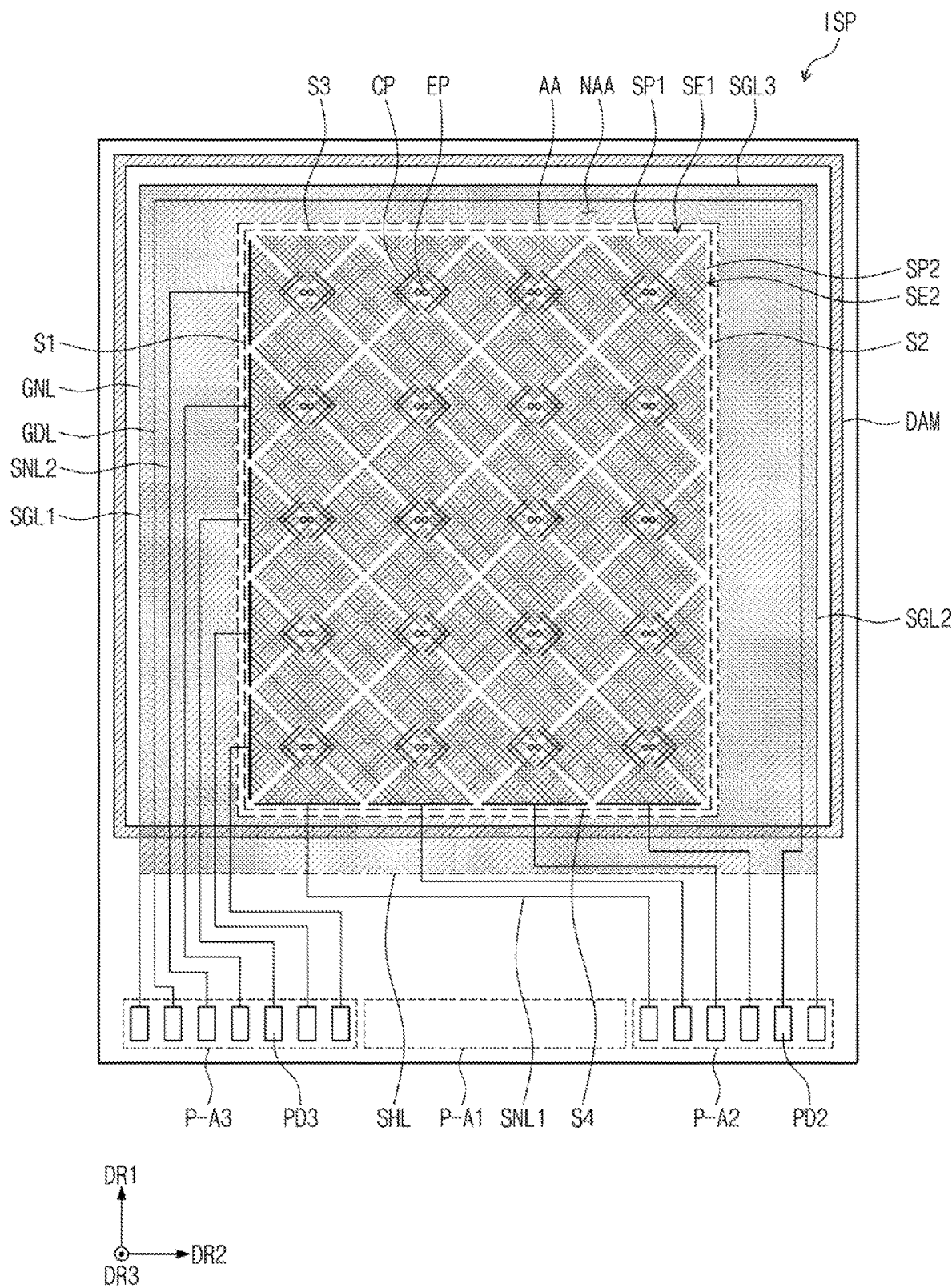

FIG. 25 shows shield layers according to some embodiments of the present invention.

Referring to FIG. 25, the inactive region NAA may be provided thereon with a shield layer SHL that extends from the ground line GNL. The shield layer SHL may be disposed to adjoin and at least partially surround the active region AA.

Figure 26:
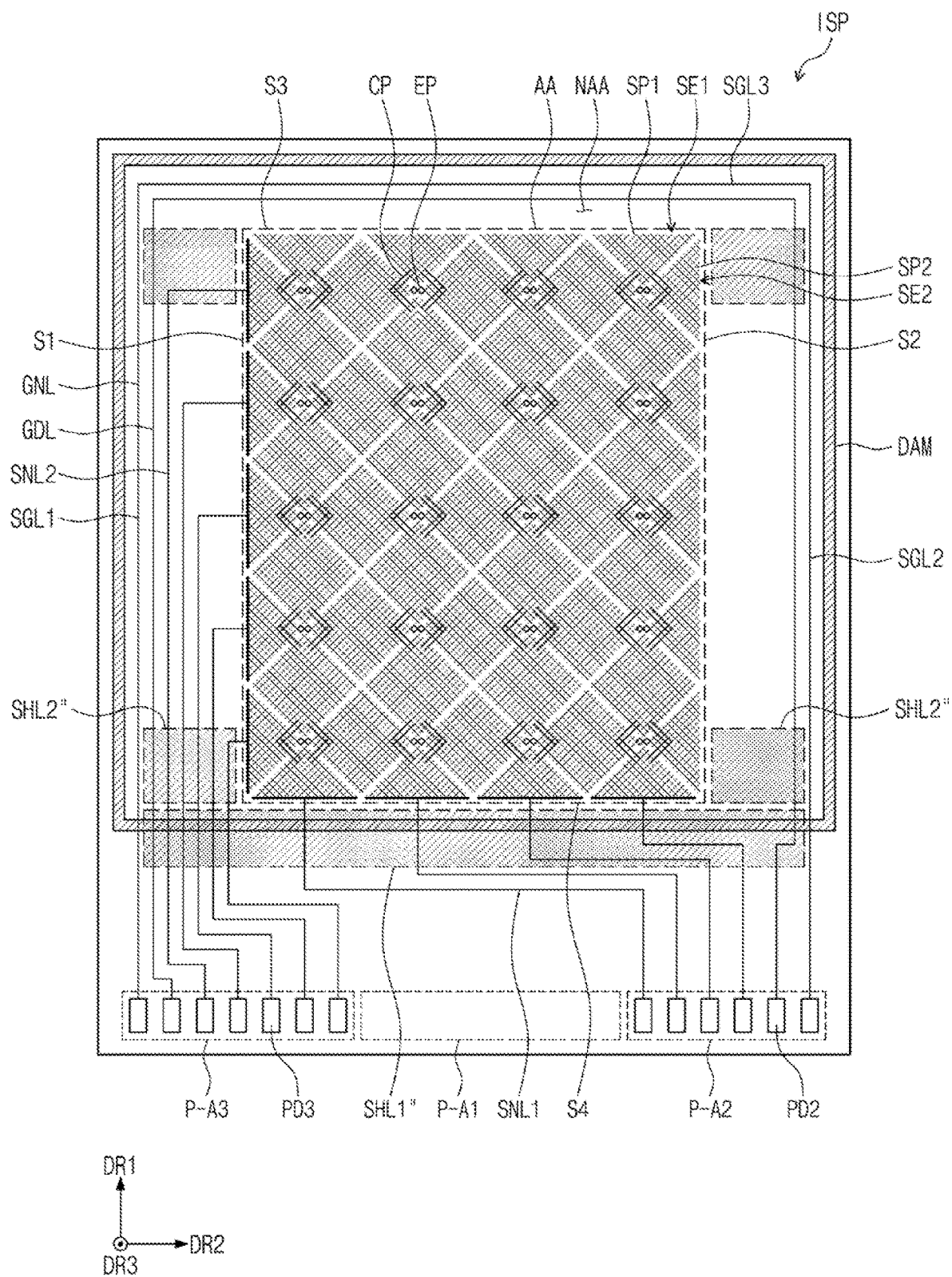

FIG. 26 shows shield layers according to some embodiments of the present invention.

Referring to FIG. 26, differently from the configuration of FIG. 6, a first shield layer SHL1" and second shield layers SHL2" may be spaced apart from the ground line GNL without extending from the ground line GNL. For example, the input sensing part ISP may be provided with the first shield layer SHL1" and the second shield layers SHL2" as independent patterns.

Figure 27:
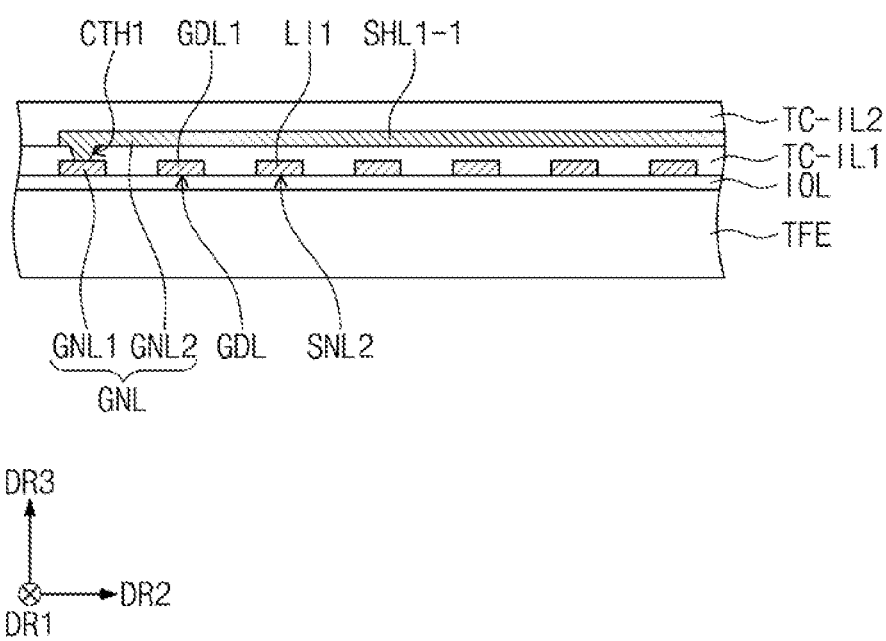

FIG. 27 shows shield layer according to some embodiments of the present invention.

FIG. 27 depicts, by way of example, a cross-sectional view corresponding to that of FIG. 12.

Referring to FIG. 27, a first shield layer SHL1-1 may extend from the second ground line GNL2 and may be disposed on the first guard line GDL1 and the first wiring lines LI1. The first guard line GDL1 and the first wiring lines LI1 may be disposed below the first shield layer SHL1-1.

Second shield layers that extend toward the first and second sides S1 and S2 of the active region AA may be formed to extend from the second ground line GNL2.

On a zone where the first shield layer SHL1-1 is disposed, the second sensing lines SNL2 may include the first wiring lines LI1, but might not include the second wiring lines LI2. In addition, on the zone where the first shield layer SHL1-1, the guard line GDL may include the first guard line GDL1, but might not include the second guard line GDL2. For example, neither the second wiring lines LI2 nor the second guard line GDL2 might be disposed on the zone where the first shield layer SHL1-1.

In the embodiment of FIG. 27, the first shield layer SHL1-1 may block an external static electricity that is applied to the input sensing part ISP. Therefore, it may be possible to prevent the second sensing lines SNL2 from signal distortion caused by static electricity.

According to an embodiment of the present invention, a shield layer that extends from a ground line of an input sensing part may block signal interference, and thus noise of the input sensing part may be reduced.

Although the present invention is described in conjunction with some embodiments thereof, it would be understood by those skilled in the art that the present invention can be modified or changed in various ways without departing from spirit and scope of the present disclosure.

What is claimed is:

1. A display device, comprising:
a display panel; and
an input sensor disposed on the display panel, the input sensor including an active region and an inactive region at least partially surrounding the active region,
wherein the input sensor includes:
a plurality of sensing electrodes disposed within the active region;
a plurality of sensing lines disposed within the inactive region and connected to the plurality of sensing electrodes;
a ground line extending outwardly to a greater extent than the plurality of sensing lines in the inactive region, the ground line surrounding the sensing lines, within the inactive region, on at least three sides thereof in a plan view, and not overlapping the sensing lines in the plan view; and
at least one shield layer extending from the ground line in the inactive region,
wherein a horizontal edge of the at least one shield layer forms a line with a horizontal edge of the active region, in the plan view,
wherein a cathode electrode of the light-emitting element of the pixel has a shape of a distorted rectangle in which two lateral sides thereof are bowed outwardly causing four corners of the cathode electrode to have a bowed angle shape and the cathode electrode overlaps the active region except for corners thereof where the horizontal edge of the active region meets a vertical edge of the active region, in the plan view, the bowed angle shaped of the four corners of the cathode electrode leaving the corners of the active region exposed,
wherein the at least one shield layer covers the corners of the active region that are not exposed by the four corners of the cathode electrode of the light-emitting element of the pixel that have the bowed angle shape, and
wherein the at least one shield layer includes a plurality of shield layers, and the plurality of shield layers are spaced apart from each other and are respectively adjacent to four corners of the active region.

2. The display device of claim 1, wherein, in a plan view, the at least one shield layer overlaps portions of the plurality of sensing lines.

3. The display device of claim 1, wherein the ground line is supplied with a ground voltage.

4. The display device of claim 1, wherein the ground line includes:
a first ground line; and
a second ground line disposed on and connected to the first ground line,
wherein the at least one shield layer extends from the first ground line.

5. The display device of claim 4, wherein each of the plurality of sensing lines includes:
a first wiring line at a same level as the first ground line; and
a second wiring line disposed on and connected to the first wiring line, the second wiring line being at a same level as the second ground line,
wherein the first wiring line is spaced apart from the at least one shield layer, and
wherein the second wiring line intersects the at least one shield layer while being insulated from the at least one shield layer.

6. The display device of claim 5, wherein the input sensor further includes a guard line disposed between the ground line and the plurality of sensing lines, wherein the guard line includes:
a first guard line at a same level as the first ground line; and
a second guard line disposed on and connected to the first guard line, the second guard line being at a same level as the second ground line,
wherein the first guard line is spaced apart from the at least one shield layer, and
wherein the second guard line intersect the at least one shield layer while being insulated from the at least one shield layer.

7. The display device of claim 6, wherein the first guard line includes:
a first extension that extends in a first direction defined as an extending direction of the first wiring line; and
a second extension that extends in a second direction from the first extension and is adjacent to the at least one shield layer, the second direction intersecting the first direction,
wherein the second extension is disposed between the at least one shield layer and the first wiring lines.

8. The display device of claim 1, wherein the display panel includes a display area that overlaps the active region and a non-display area that overlaps the inactive region,
wherein the display panel includes:
a plurality of pixels disposed in the display area; and
at least one dam disposed in the non-display area and at least partially surrounding the display area.

9. The display device of claim 8, wherein, in a plan view, the at least one shield layer overlaps a portion of the at least one dam.

10. The display device of claim 8, wherein the active region includes:

a first side and a second side that each extend in a first direction and are opposite to each other with respect to a second direction that intersects the first direction; and
a third side and a fourth side that each extend in the second direction and are opposite to each other with respect to the first direction, and
wherein the ground line includes:
a first sub-ground line disposed in the inactive region proximate to the first side; and
a second sub-ground line disposed in the inactive region proximate to the second side.

11. The display device of claim 10, wherein the at least one shield layer includes a first shield layer adjacent to the fourth side, the first shield layer extending in the second direction, wherein, in a plan view, the first shield layer overlaps a portion of the at least one dam proximate to the fourth side.

12. The display device of claim 11, wherein the first shield layer extends from the first sub-ground line.

13. The display device of claim 11, wherein the first shield layer extends from the second sub-ground line.

14. The display device of claim 11, wherein the first shield layer extends from each of the first sub-ground line and the second sub-ground line.

15. The display device of claim 10, wherein the at least one shield layer includes a plurality of second shield layers that each extend from the first sub-ground line toward the first side and extend from the second sub-ground line toward the second side.

16. The display device of claim 15, wherein the plurality of second shield layers are exclusively disposed adjacent to a portion of the first side proximate to the third side, a portion of the first side proximate to the fourth side, a portion of the second side proximate to the third side, and a portion of the second side proximate to the fourth side.

17. The display device of claim 10, wherein the at least one shield layer further includes a plurality of second shield layers that each extend toward the first side, the second side, and the third side.

18. The display device of claim 1, wherein the at least one shield layer is disposed in the inactive region and adjacent to the active region, and the at least one shield layer at least partially surrounds the active region.

19. The display device of claim 1, wherein the ground line includes:
a first ground line; and
a second ground line disposed on and connected to the first ground line,
wherein the at least one shield layer extends from the second ground line.

20. A display device, comprising:
a display panel that includes a pixel disposed in a display area and a dam disposed in a non-display area at least partially surrounding the display area, the dam at least partially surrounding the display area; and
an input sensor disposed on the display panel, the input sensor including an active region and an inactive region at least partially surrounding the active region,
wherein the input sensor includes:
a plurality of sensing electrodes disposed in the active region;
a plurality of sensing lines disposed within the inactive region and connected to the plurality of sensing electrodes;
a ground line disposed in the inactive region;
a first shield layer extending from the ground line and overlapping a portion of the dam in the inactive region; and
a plurality of second shield layers extending from the ground line toward the active region in the inactive region,
wherein the ground line surrounds the sensing lines, within the inactive region, on at least three sides thereof in a plan view, and does not overlap the sensing lines in the plan view,
wherein a horizontal edge of at least one second shield layer of the plurality of second shield layers forms a line with a horizontal edge of the active region, in a plan view,
wherein a cathode electrode of a light-emitting element of a pixel of the display panel has a shape of a distorted rectangle in which two lateral sides thereof are bowed outwardly causing four corners of the cathode electrode to have a bowed angled shape and the cathode electrode overlaps the active region except for corners thereof where the horizontal edge of the active region meets a vertical edge of the active region, in the plan view, the bowed angle shaped of the four corners of the cathode electrode leaving the corners of the active region exposed,
wherein the at least one second shield layer covers the corners of the active region that are exposed by the four corners of the cathode electrode of the light-emitting element of a pixel of the display panel that have the bowed angle shape, and
wherein the plurality of second shields are spaced apart from each other and are respectively adjacent to four corners of the active region.

21. A display device, comprising:
a display panel; and
an input sensor disposed on the display panel, the input sensor including an active region and an inactive region at least partially surrounding the active region,
wherein the input sensor includes:
a plurality of sensing electrodes disposed in the active region;
a plurality of sensing lines disposed in the inactive region and connected to the plurality of sensing electrodes;
a ground line extending outwardly to a greater extent than the plurality of sensing lines in the active region; and
a plurality of shield layers extending from the ground line in the active region,
wherein, in a plan view, each of the plurality of shield layers intersect at least one of the plurality of sensing lines,
wherein the ground line surrounds the sensing lines, within the inactive region, on at least three sides thereof in the plan view, and does not overlap the sensing lines in the plan view,
wherein a horizontal edge of at least one shield layer of the plurality of shield layers forms a line with a horizontal edge of the active region, in the plan view,
wherein a cathode electrode of the light-emitting element of a pixel of the display panel has a shape of a distorted rectangle in which two lateral sides thereof are bowed outwardly causing four corners of the cathode electrode to have a bowed angle shape and the cathode electrode overlaps the active region except for corners thereof where the horizontal edge of the active region meets a vertical edge of the active region, in the plan view, the bowed angle shaped of the four corners of the cathode electrode leaving the corners of the active region exposed, wherein the at least one shield layer covers the corners of the active region that are exposed by the four corners of the cathode electrode of the light-emitting element of a pixel of the display panel that have the bowed angle shape, and wherein the plurality of shield layers are spaced apart from each other and are respectively adjacent to four corners of the active region.

* * * * *